United States Patent
Milbar

(10) Patent No.: US 7,352,817 B2
(45) Date of Patent: Apr. 1, 2008

(54) METHOD AND APPARATUS FOR INTERLEAVING SIGNAL BITS IN A DIGITAL AUDIO BROADCASTING SYSTEM

(75) Inventor: Marek Milbar, Huntingdon Valley, PA (US)

(73) Assignee: iBiquity Digital Corporation, Columbia, MD (US)

( * ) Notice: Subject to any disclaimer, the term of this patent is extended or adjusted under 35 U.S.C. 154(b) by 655 days.

(21) Appl. No.: 10/672,441

(22) Filed: Sep. 26, 2003

(65) Prior Publication Data

US 2004/0063399 A1  Apr. 1, 2004

Related U.S. Application Data

(60) Provisional application No. 60/414,106, filed on Sep. 27, 2002.

(51) Int. Cl.
H04L 25/00 (2006.01)
(52) U.S. Cl. .................................................. 375/259
(58) Field of Classification Search ................ 375/259, 375/261–265, 295, 316; 714/701, 702; 711/157
See application file for complete search history.

(56) References Cited

U.S. PATENT DOCUMENTS

| | | | |
|---|---|---|---|
| 5,278,826 A | 1/1994 | Murphy et al. | |
| 5,278,844 A | 1/1994 | Murphy et al. | |
| 5,283,780 A | 2/1994 | Schuchman et al. | |
| 5,315,583 A | 5/1994 | Murphy et al. | |
| 5,465,396 A | 11/1995 | Hunsinger et al. | |
| 5,572,532 A | 11/1996 | Fimoff et al. | |
| 5,588,022 A | 12/1996 | Dapper et al. | |
| 5,659,580 A | 8/1997 | Partyka | |
| 5,719,875 A | 2/1998 | Wei | |
| 5,949,796 A | 9/1999 | Kumar | |
| 6,108,810 A | 8/2000 | Kroeger et al. | |
| 6,128,334 A | 10/2000 | Dapper et al. | |
| 6,178,317 B1 | 1/2001 | Kroeger et al. | |
| 6,178,530 B1 | 1/2001 | Aman et al. | |
| 6,259,893 B1 | 7/2001 | Kroeger et al. | |
| 6,332,186 B1 | 12/2001 | Elwood et al. | |
| 6,345,377 B1 | 2/2002 | Kroeger et al. | |
| 6,347,122 B1 | 2/2002 | Chen et al. | |
| 6,351,832 B1 | 2/2002 | Wei | |
| 6,430,227 B1 | 8/2002 | Kroeger et al. | |
| 6,510,175 B1 | 1/2003 | Hunsinger et al. | |

(Continued)

FOREIGN PATENT DOCUMENTS

EP  1087584 A2  3/2001

(Continued)

*Primary Examiner*—Don N. Vo
(74) *Attorney, Agent, or Firm*—Robert P. Lenart, Esq.; Pietragallo Gordon Alfano Bosick & Raspanti, LLP

(57) ABSTRACT

This invention provides a method for interleaving bits of a digital signal representative of data and/or audio in a digital audio broadcasting system, the method comprising the step of: writing a plurality of bits of the digital signal to a matrix; and reading the bits from the matrix, wherein at least one of the writing and reading steps follows a non-sequential addressing scheme. Apparatus for transmitting the interleaved bits, and apparatus for receiving and deinterleaving the bits are also provided.

46 Claims, 17 Drawing Sheets

U.S. PATENT DOCUMENTS

| | | |
|---|---|---|
| 6,523,147 B1 | 2/2003 | Kroeger et al. |
| 6,553,517 B1 | 4/2003 | Prasad |
| 6,556,639 B1 | 4/2003 | Goldston et al. |
| 6,684,367 B1 | 1/2004 | Maerkle et al. |
| 6,748,561 B2 * | 6/2004 | Prasad ......................... 714/702 |
| 6,768,778 B1 | 7/2004 | Chen et al. |
| 6,785,862 B1 * | 8/2004 | Zhang ......................... 714/788 |
| 6,944,206 B1 * | 9/2005 | Dent ........................... 375/144 |
| 6,963,622 B2 * | 11/2005 | Eroz et al. .................... 375/298 |
| 6,985,516 B1 * | 1/2006 | Easton et al. ................ 375/150 |
| 6,985,537 B1 | 1/2006 | Milbar |
| 2002/0046329 A1 | 4/2002 | Song |

FOREIGN PATENT DOCUMENTS

WO     WO 0115358 A2     3/2001

\* cited by examiner

FROM CHANNEL ENCODING

TO OFDM SUBCARRIER MAPPING

METHOD AND APPARATUS FOR INTERLEAVING SIGNAL BITS IN A DIGITAL AUDIO BROADCASTING SYSTEM

CROSS-REFERENCE TO RELATED APPLICATION

This application claims the benefit of U.S. Provisional Patent Application Ser. No. 60/414,106, filed Sep. 27, 2002, the disclosure of which is hereby incorporated by reference.

FIELD OF THE INVENTION

This invention relates to In-Band On-Channel (IBOC) Digital Audio Broadcasting (DAB), and more particularly to methods and apparatus for interleaving signal bits in a DAB system.

BACKGROUND OF THE INVENTION

IBOC DAB systems are designed to permit a smooth evolution from current analog Amplitude Modulation (AM) and Frequency Modulation (FM) radio to a fully digital In-Band On-Channel system. These systems can deliver digital audio and data services to mobile, portable, and fixed receivers from terrestrial transmitters in the existing Medium Frequency (MF) and Very High Frequency (VHF) radio bands. Broadcasters may continue to transmit analog AM and FM simultaneously with the new, higher-quality and more robust digital signals, allowing conversion from analog to digital radio while maintaining current frequency allocations.

Digital Audio Broadcasting (DAB) can provide digital-quality audio, superior to existing analog broadcasting formats. Both AM and FM In-Band On-Channel DAB signals can be transmitted in a hybrid format where the digitally modulated signal coexists with the currently broadcast analog signal, or in an all-digital format where the analog signal has been eliminated. IBOC DAB requires no new spectral allocations because each IBOC DAB signal is transmitted within the spectral mask of an existing AM or FM channel allocation. IBOC DAB promotes economy of spectrum while enabling broadcasters to supply digital quality audio to the present base of listeners.

One AM IBOC DAB system, set forth in U.S. Pat. No. 5,588,022, presents a method for simultaneously broadcasting analog and digital signals in a standard AM broadcasting channel. Using this approach, an amplitude-modulated radio frequency signal having a first frequency spectrum is broadcast. The amplitude-modulated radio frequency signal includes a first carrier modulated by an analog program signal. Simultaneously, a plurality of digitally modulated carrier signals are broadcast within a bandwidth that encompasses the first frequency spectrum. Each digitally modulated carrier signal is modulated by a portion of a digital program signal. A first group of the digitally modulated carrier signals lies within the first frequency spectrum and is modulated in quadrature with the first carrier signal. Second and third groups of the digitally-modulated carrier signals lie in upper and lower sidebands outside of the first frequency spectrum and are modulated both in-phase and in-quadrature with the first carrier signal. Multiple carriers employ orthogonal frequency division multiplexing (OFDM) to bear the communicated information.

FM IBOC DAB systems have been the subject of several United States patents including U.S. Pat. Nos. 6,510,175; 6,108,810; 5,949,796; 5,465,396; 5,315,583; 5,278,844 and 5,278,826. In an FM compatible digital audio broadcasting system, digitally encoded audio information is transmitted simultaneously with the existing analog FM signal channel. The advantages of digital transmission for audio include better signal quality with less noise and wider dynamic range than with existing FM radio channels. Initially the hybrid format would be used allowing existing receivers to continue to receive the analog FM signal while allowing new IBOC DAB receivers to decode the digital signal. Sometime in the future, when IBOC DAB receivers are abundant, broadcasters may elect to transmit the all-digital format. Hybrid IBOC DAB can provide virtual CD-quality stereo digital audio (plus data) while simultaneously transmitting the existing FM signal. All-digital IBOC DAB can provide virtual CD-quality stereo audio along with a data channel.

One proposed FM IBOC DAB uses a signal that includes orthogonal frequency division multiplexed (OFDM) subcarriers in the region from about 129 kHz to 199 kHz away from the FM center frequency, both above and below the spectrum occupied by an analog modulated host FM carrier. An IBOC option, shown in U.S. Pat. No. 6,430,227, permits subcarriers starting as close as 100 kHz away from the center frequency. The bandwidth of the existing analog FM signal is significantly smaller than the bandwidth occupied by the OFDM subcarriers.

OFDM signals include a plurality of orthogonally spaced carriers all modulated at a common symbol rate. The frequency spacing for the pulse symbols (e.g., BPSK, QPSK, 8 PSK or QAM) is equal to the symbol rate. For IBOC transmission of FM DAB signals, redundant sets of OFDM subcarriers are placed in an upper sideband (USB) and a lower sideband (LSB) on either side of a coexisting analog FM carrier. The DAB subcarrier power is set to about −25 dB relative to the FM signal. The level and spectral occupancy of the DAB signal is set to limit interference to its FM host while providing adequate signal-to-noise ratio (SNR) for the DAB sub-carriers. Certain ones of the subcarriers can be reserved as reference subcarriers to transmit control signals to the receivers.

One feature of digital transmission systems is the inherent ability to simultaneously transmit both digitized audio and data. Digital audio information is often compressed for transmission over a bandlimited channel. For example, it is possible to compress the digital source information from a stereo compact disk (CD) at approximately 1.5 Mbps down to 96 kbps while maintaining the virtual-CD sound quality for FM IBOC DAB. Further compression down to 48 kbps and below can still offer good stereo audio quality, which is useful for the AM DAB system or a low-latency backup and tuning channel for the FM DAB system. Various data services can be implemented using the composite DAB signal. For example, a plurality of data channels can be broadcast within the composite DAB signal.

U.S. patent application Ser. No. 09/382,716, filed Aug. 24, 1999, and titled "Method And Apparatus For Transmission And Reception Of Compressed Audio Frames With Prioritized Messages For Digital Audio Broadcasting" (PCT Published Patent Application No. WO 0115358) discloses a method and apparatus for assembling modem frames for transmission in IBOC DAB systems, and is hereby incorporated by reference.

The present invention provides methods and apparatus for interleaving bits of digital information in an IBOC DAB system.

SUMMARY OF THE INVENTION

This invention provides a method for interleaving bits of a digital signal representative of data and/or audio in a digital audio broadcasting system, the method comprising the step of: writing a plurality of bits of the digital signal to a matrix; and reading the bits from the matrix, wherein at least one of the writing and reading steps follows a non-sequential addressing scheme.

The number of bits in the matrix can be equal to the number of bits in a transfer frame of the digital signal. The bits in the matrix are arranged in a plurality of partitions, and each of the partitions can include a plurality of blocks.

Each of the partitions can include a group of the bits representative of a logical channel, and the bits of the logical channels can be scrambled.

The invention also encompasses a method of broadcasting digital information representative of data and/or audio in a digital audio broadcasting system, the method comprising the steps of: receiving a plurality of bits of a digital signal to be transmitted; writing the bits to a matrix; reading the bits from the matrix, wherein at least one of the writing and reading steps follows a non-sequential addressing scheme; mapping the bits to a plurality of carrier signals; and transmitting the carrier signals.

The bits can be channel coded prior to the step of writing the bits of the digital signal to the matrix. The bits can also be scrambled prior to the step of writing the bits of the digital signal to the matrix.

In another aspect, the invention provides an apparatus for interleaving bits of a digital signal representative of data and/or audio in a digital audio broadcasting system, the apparatus comprising: means for receiving a plurality of bits of a digital signal to be transmitted; means for writing the bits to a matrix; and means for reading the bits from the matrix, wherein at least one of the means for writing and the means for reading follows a non-sequential addressing scheme.

The invention further encompasses an apparatus for broadcasting digital information representative of data and/or audio in a digital audio broadcasting system, the apparatus comprising: means for receiving a plurality of bits of a digital signal to be transmitted; means for writing the bits of the digital signal to a matrix; means for reading the bits from the matrix, wherein at least one of the means for writing and the means for reading follows a non-sequential addressing scheme; means for mapping the bits to a plurality of carrier signals; and means for transmitting the carrier signals.

In another aspect, the invention provides a method for deinterleaving received bits of a digital signal representative of data and/or audio in a digital audio broadcasting system, the method comprising the steps of: writing a plurality of received bits of the digital signal to a matrix; and reading the bits from the matrix, wherein at least one of the writing and reading steps follows a non-sequential addressing scheme.

The invention further encompasses a method of receiving digital information representative of data and/or audio in a digital audio broadcasting system, the method comprising the steps of: receiving a plurality of bits of a digital signal; writing the bits to a matrix; reading the bits from the matrix, wherein at least one of the means for writing and means for reading follows a non-sequential addressing scheme; and using the read bits to produce an output signal.

The invention also encompasses an apparatus for deinterleaving bits of a digital signal representative of data and/or audio in a digital audio broadcasting system, the apparatus comprising: means for receiving a plurality of bits of a digital signal; means for writing the bits to a matrix; and means for reading the bits from the matrix, wherein at least one of the means for writing and means for reading follows a non-sequential addressing scheme.

In another aspect, the invention provides an apparatus of receiving digital information representative of data and/or audio in a digital audio broadcasting system, the apparatus comprising: means for receiving a plurality of bits of a digital signal; means for writing the bits of the digital signal to a matrix; means for reading the bits from the matrix, wherein at least one of the means for writing and means for reading follows a non-sequential addressing scheme; and means for using the read bits to produce an output signal.

DETAILED DESCRIPTION OF THE INVENTION

Figure 1:
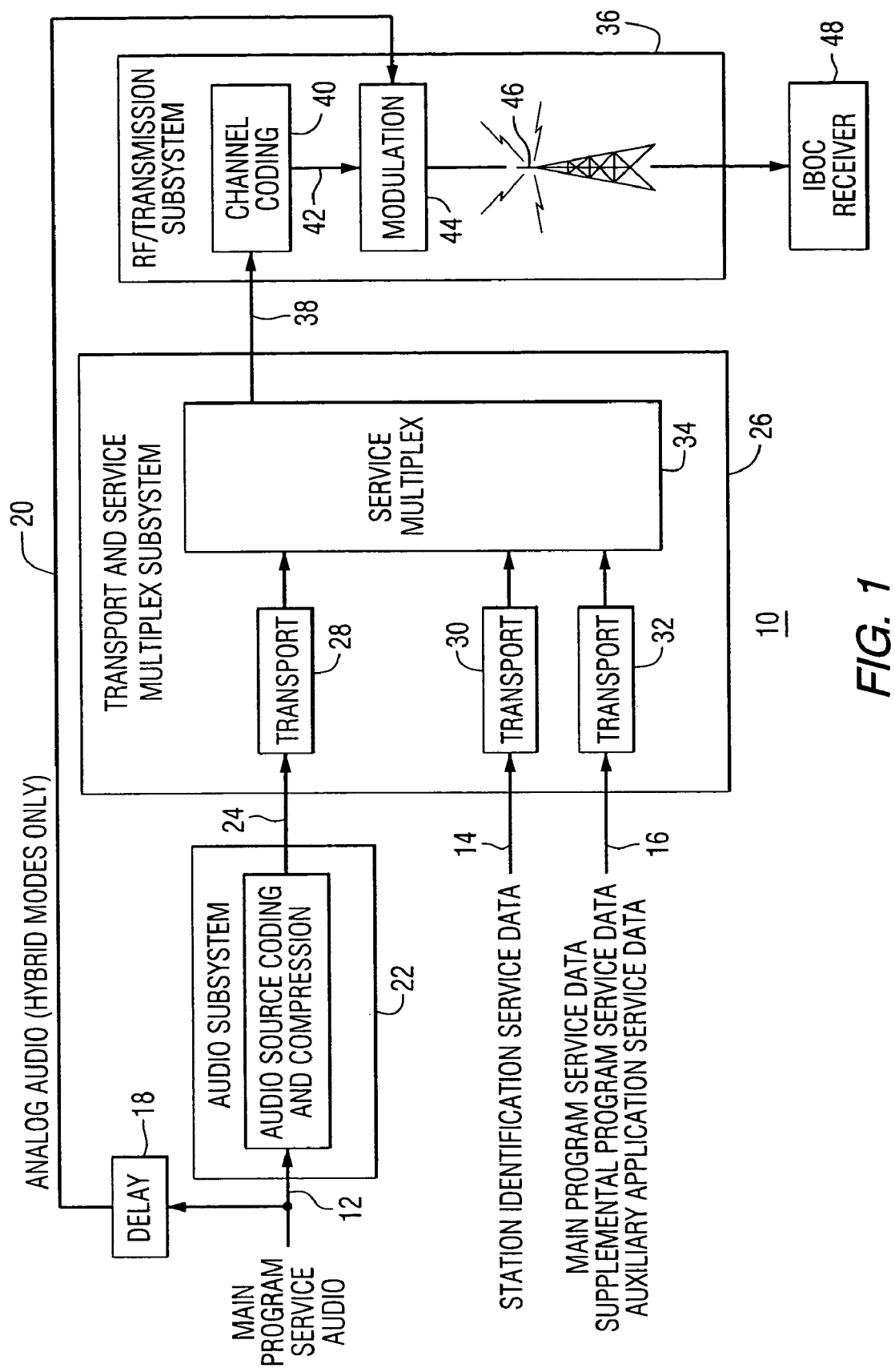
FIG. 1 is a functional block diagram of a transmitter for use in a digital audio broadcasting system.

Referring to the drawings, FIG. 1 is a functional block diagram of a transmitter 10 for use in a digital audio broadcasting system. The transmitter includes an input 12 for receiving a main program service audio signal, an input 14 for receiving station identification service data, and an input 16 for receiving main program service data, supplemental program service data, and auxiliary application service data. For hybrid DAB, the analog version of the main program service audio signal is delayed as shown by block 18 to produce a delayed analog audio signal on line 20. An audio subsystem 22 encodes and compresses the main program service audio signal to produce an encoded compressed digital signal on line 24. A transport and service multiplex subsystem 26 receives the encoded compressed digital signal, the station identification service data, the main program service data, supplemental program service data, and auxiliary application service data, and subjects those signals to various transport signal processing as discussed further below and represented in FIG. 1 as blocks 28, 30 and 32. The resulting signals are multiplexed by service multiplexer 34 and sent to the RF transmission subsystem 36. The digital signal on line 38 is channel coded as shown by block 40 and the resulting coded signal on line 42 is modulated along with the analog audio signal as illustrated by block 44. The resulting signal can then be amplified and broadcast by antenna 46 to at least one of a plurality of IBOC DAB receivers 48.

The system employs coding to reduce the sampled audio signal bit rate and baseband signal processing and to increase the robustness of the signal in the transmission channel. This allows a high quality audio signal plus ancillary data to be transmitted in band segments and at low levels which do not interfere with the existing analog signals.

IBOC DAB signals can be transmitted in a hybrid format including an analog modulated carrier in combination with a plurality of digitally modulated carriers or in an all-digital format wherein the analog modulated carrier is not used.

Diversity delay provides a fixed time delay in one of two channels carrying the same information to defeat non-stationary channel impairments such as fading and impulsive noise.

Figure 2:
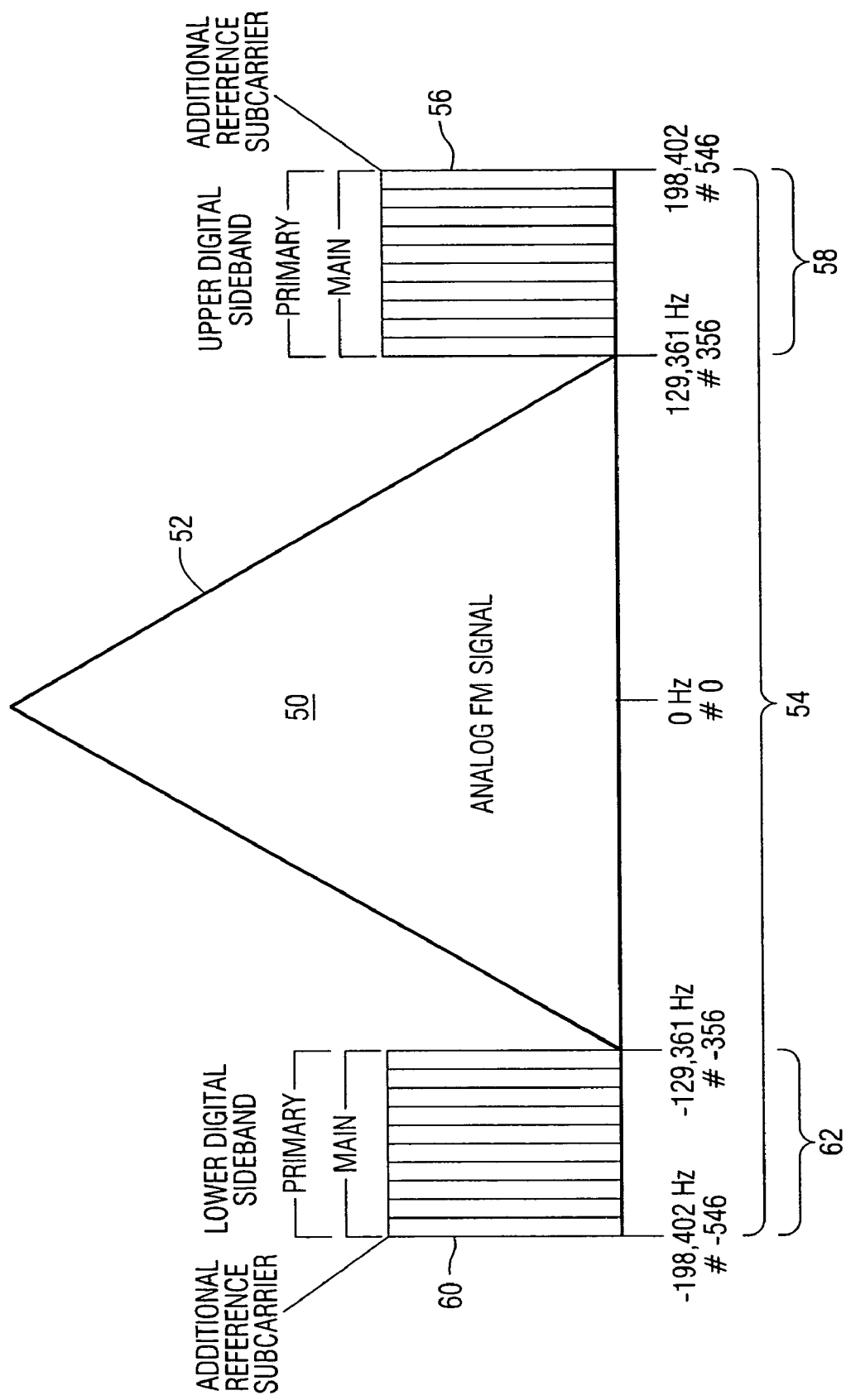
FIG. 2 is a schematic representation of a hybrid FM IBOC waveform.

FIG. 2 is a schematic representation of a hybrid FM IBOC waveform 50. The waveform includes an analog modulated signal 52 located in the center of a broadcast channel 54, a first plurality of evenly spaced orthogonally frequency division multiplexed subcarriers 56 in an upper sideband 58, and a second plurality of evenly spaced orthogonally frequency division multiplexed subcarriers 60 in a lower sideband 62. The digitally modulated subcarriers are broadcast at a lower power level than the analog modulated carrier to comply with required channel signal masks. The digitally modulated subcarriers are divided into partitions and various subcarriers are designated as reference subcarriers. A frequency partition is a group of 19 OFDM subcarriers containing 18 data subcarriers and one reference subcarrier.

The hybrid waveform includes an analog FM-modulated signal, plus digitally modulated Primary Main subcarriers. The subcarriers are located at evenly spaced frequency locations. The subcarrier locations are numbered from −546 to +546. In the waveform of FIG. 2, the subcarriers are at locations +356 to +546 and −356 to −546. This waveform will normally be used during an initial transitional phase preceding conversion to the All Digital waveform.

The digital signal is transmitted in primary main sidebands on either side of the analog FM signal, as shown in FIG. 2. Each primary main sideband is comprised of ten frequency partitions, which are allocated among subcarriers 356 through 545, or −356 through −545. Subcarriers 546 and −546, also included in the primary main sidebands, are additional reference subcarriers. The amplitude of each subcarrier can be scaled by an amplitude scale factor.

In the hybrid waveform, the digital signal is transmitted in Primary Main (PM) sidebands on either side of the analog FM signal, as shown in FIG. 2. Each PM sideband is comprised of ten frequency partitions, which are allocated among subcarriers 356 through 545, or −356 through −545. Subcarriers 546 and −546, also included in the PM sidebands, are additional reference subcarriers. The amplitude of each subcarrier is scaled by an amplitude scale factor.

Figure 3:
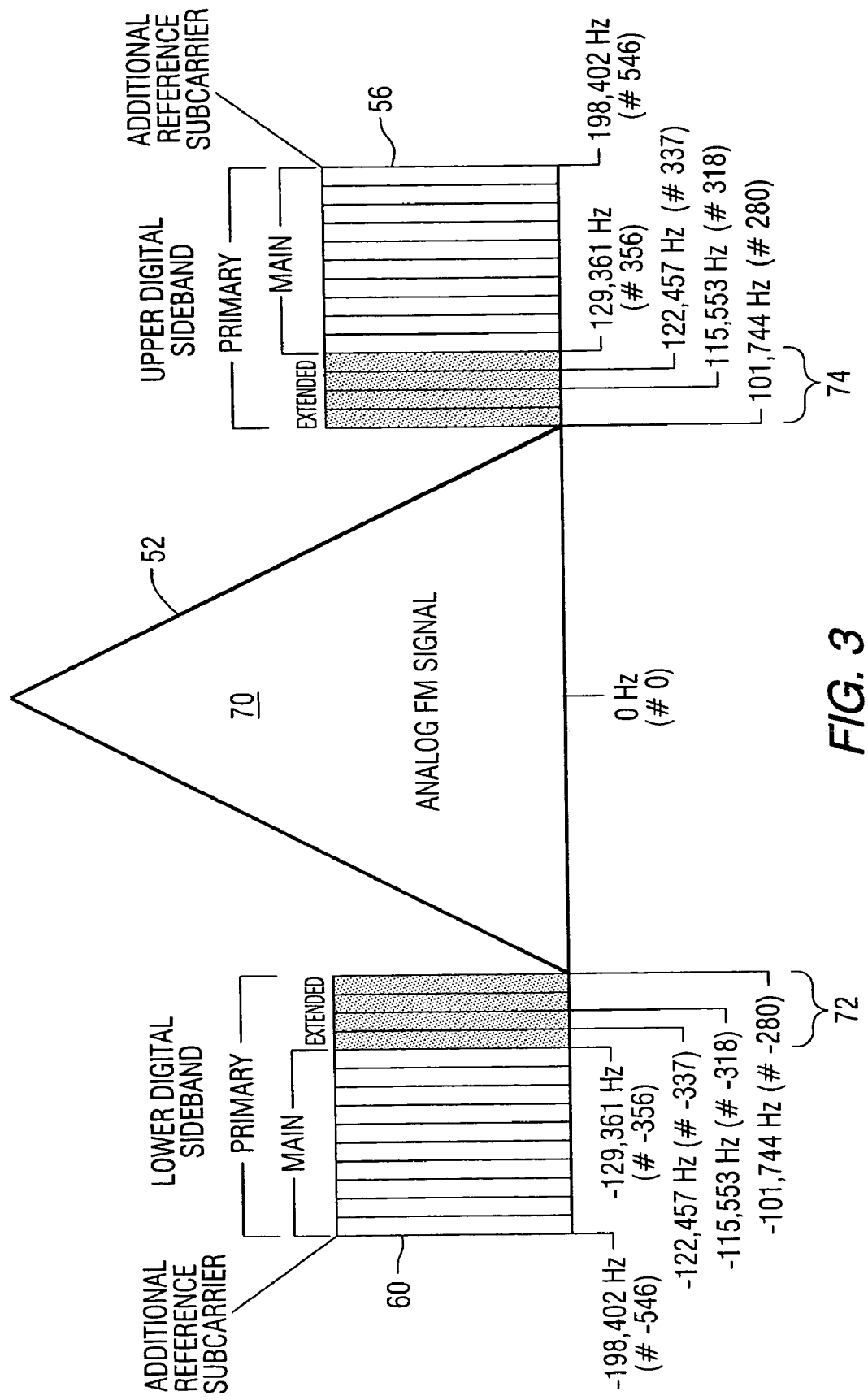
FIG. 3 is a schematic representation of an extended hybrid FM IBOC waveform.

FIG. 3 is a schematic representation of an extended hybrid FM IBOC waveform 70. The extended hybrid waveform is created by adding primary extended sidebands 72, 74 to the primary main sidebands present in the hybrid waveform. Depending on the service mode, one, two, or four frequency partitions can be added to the inner edge of each primary main sideband.

The Extended Hybrid waveform includes the analog FM signal plus digitally modulated primary main subcarriers (subcarriers +356 to +546 and −356 to −546) and some or all primary extended subcarriers (subcarriers +280 to +355 and −280 to −355). This waveform will normally be used during an initial transitional phase preceding conversion to the All Digital waveform.

Each primary main sideband includes ten frequency partitions and an additional reference subcarrier spanning subcarriers 356 through 546, or −356 through −546. The upper primary extended sidebands include subcarriers 337 through 355 (one frequency partition), 318 through 355 (two frequency partitions), or 280 through 355 (four frequency partitions). The lower primary extended sidebands include subcarriers −337 through −355 (one frequency partition), −318 through −355 (two frequency partitions), or −280 through −355 (four frequency partitions). The amplitude of each subcarrier can be scaled by an amplitude scale factor.

Figure 4:
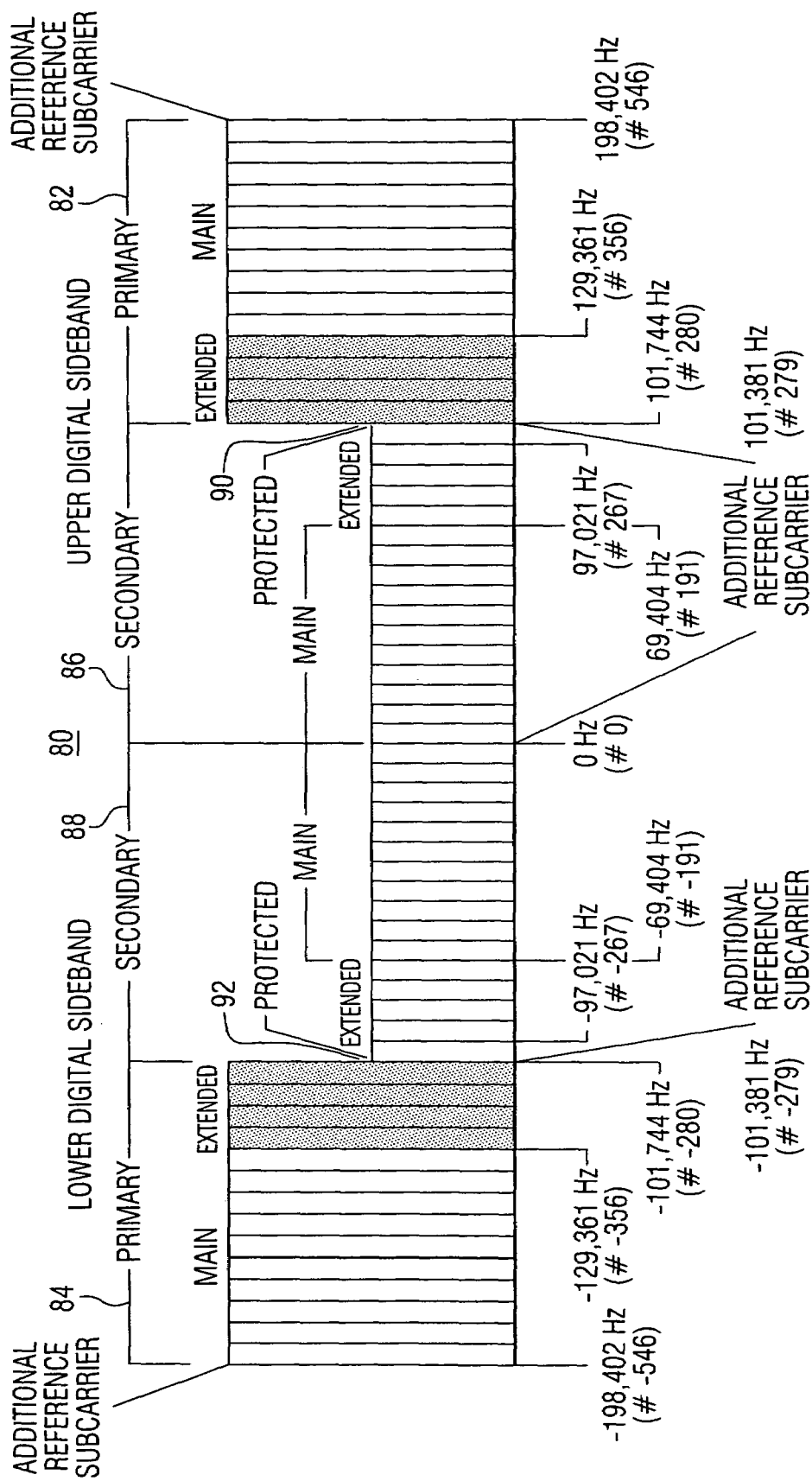
FIG. 4 is a schematic representation of an all-digital FM IBOC waveform.

FIG. 4 is a schematic representation of an all-digital FM IBOC waveform 80. The all-digital waveform is constructed by disabling the analog signal, fully expanding the bandwidth of the primary digital sidebands 82, 84, and adding lower-power secondary sidebands 86, 88 in the spectrum vacated by the analog signal. The all-digital waveform in the illustrated embodiment includes digitally modulated subcarriers at subcarrier locations −546 to +546, without an analog FM signal.

In addition to the ten main frequency partitions, all four extended frequency partitions are present in each primary sideband of the All Digital waveform. Each secondary sideband also has ten Secondary Main (SM) and four Secondary Extended (SX) frequency partitions. Unlike the primary sidebands, however, the Secondary Main frequency partitions are mapped nearer to channel center with the extended frequency partitions farther from the center.

Each secondary sideband also supports a small Secondary Protected (SP) region 90, 92 including 12 OFDM subcarriers and reference subcarriers 279 and −279. The sidebands are referred to as "protected" because they are located in the area of spectrum least likely to be affected by analog or digital interference. An additional reference subcarrier is placed at the center of the channel (0). Frequency partition ordering of the SP region does not apply since the SP region does not contain frequency partitions.

Each Secondary Main sideband spans subcarriers 1 through 190 or −1 through −190. The upper Secondary Extended sideband includes subcarriers 191 through 266, and the upper Secondary Protected sideband includes subcarriers 267 through 278, plus additional reference subcarrier 279. The lower Secondary Extended sideband includes subcarriers −191 through −266, and the lower Secondary Protected sideband includes subcarriers −267 through −278, plus additional reference subcarrier −279. The total frequency span of the entire All Digital spectrum is 396,803 Hz. The amplitude of each subcarrier can be scaled by an amplitude scale factor. The secondary sideband amplitude scale factors can be user selectable. Any one of the four may be selected for application to the secondary sidebands.

The various DAB waveforms provide a flexible means of transitioning to a digital broadcast system by providing three new waveform types: Hybrid, Extended Hybrid, and All Digital. The Hybrid and Extended Hybrid types retain the analog FM signal, while the All Digital type does not. All three waveform types conform to the currently allocated spectral emissions mask.

The digital signal is modulated using orthogonal frequency division multiplexing (OFDM). OFDM is a parallel modulation scheme in which the data stream modulates a large number of orthogonal subcarriers, which are transmitted simultaneously. OFDM is inherently flexible, readily allowing the mapping of logical channels to different groups of subcarriers.

In the Hybrid waveform, the digital signal is transmitted in Primary Main (PM) sidebands on either side of the analog FM signal in the Hybrid waveform. The power level of each sideband is appreciably below the total power in the analog FM signal. The analog signal may be monophonic or stereo, and may include subsidiary communications authorization (SCA) channels.

In the Extended Hybrid waveform, the bandwidth of the Hybrid sidebands can be extended toward the analog FM signal to increase digital capacity. This additional spectrum, allocated to the inner edge of each Primary Main sideband, is termed the Primary Extended (PX) sideband.

In the All Digital waveform, the analog signal is removed and the bandwidth of the primary digital sidebands is fully extended as in the Extended Hybrid waveform. In addition, this waveform allows lower-power digital secondary sidebands to be transmitted in the spectrum vacated by the analog FM signal.

Figure 5:
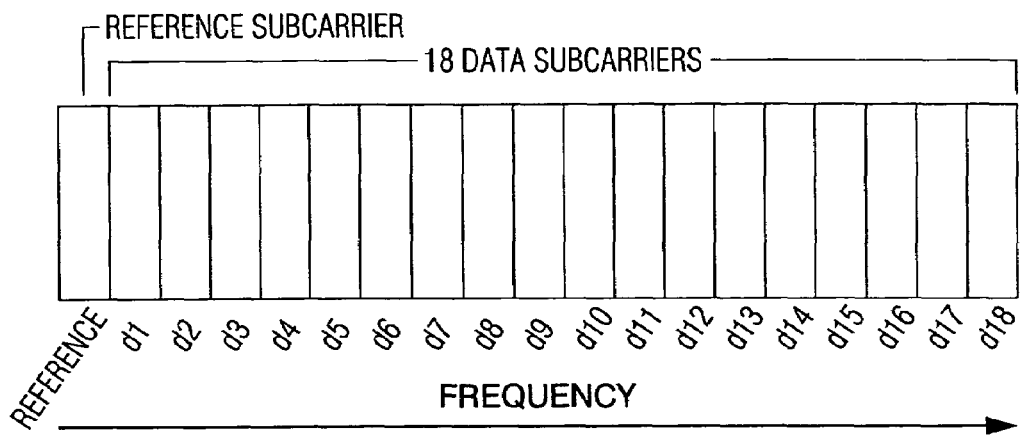
FIG. 5 is a schematic representation of a partition of subcarriers in a DAB waveform.
Figure 6:
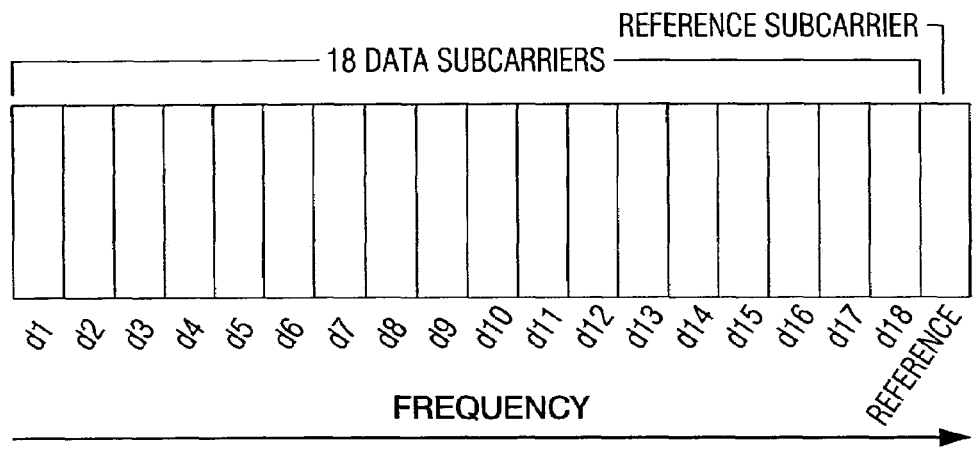
FIG. 6 is another schematic representation of a partition of subcarriers in a DAB waveform.

The OFDM subcarriers are assembled into frequency partitions. Each frequency partition is comprised of eighteen data subcarriers and one reference subcarrier, as shown in FIG. 5 (ordering A) and FIG. 6 (ordering B). The position of the reference subcarrier (ordering A or B) varies with the location of the frequency partition within the spectrum.

Figure 7:
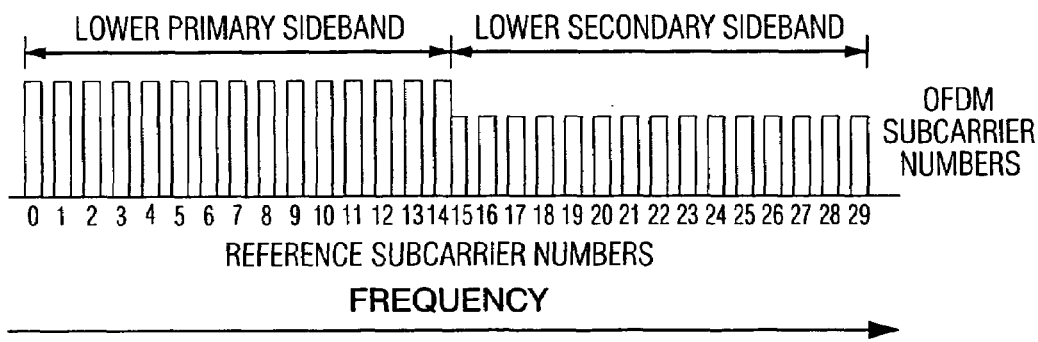
FIG. 7 is a schematic representation of reference subcarriers in a lower sideband of a DAB waveform.
Figure 8:
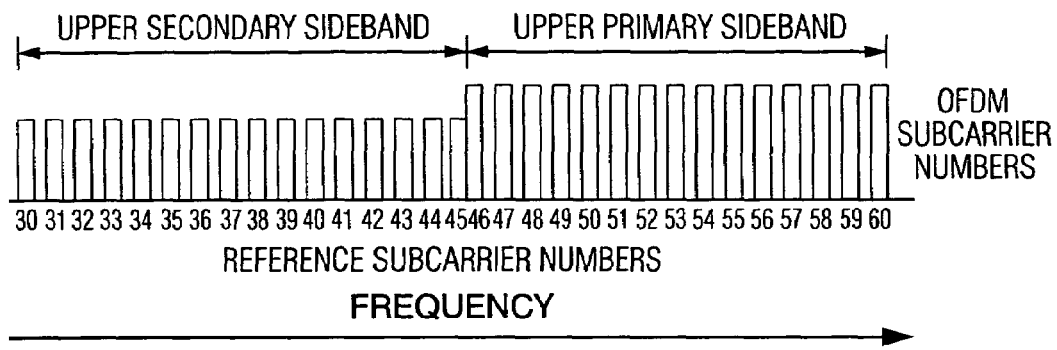
FIG. 8 is a schematic representation of reference subcarriers in an upper sideband of a DAB waveform.

Besides the reference subcarriers resident within each frequency partition, depending on the service mode, up to five additional reference subcarriers are inserted into the spectrum at subcarrier numbers −546, −279, 0, 279, and 546. The overall effect is a regular distribution of reference subcarriers throughout the spectrum. For notational convenience, each reference subcarrier is assigned a unique identification number between 0 and 60. All lower sideband reference subcarriers are shown in FIG. 7. All upper sideband reference subcarriers are shown in FIG. 8. The figures indicate the relationship between reference subcarrier numbers and OFDM subcarrier numbers.

Each spectrum shown in the drawings includes subcarrier numbers and the center frequency of certain key OFDM subcarriers. The center frequency of a subcarrier is calculated by multiplying the subcarrier number by the OFDM subcarrier spacing $\Delta f$. The center of subcarrier 0 is located at 0 Hz. In this context, center frequency is relative to the radio frequency (RF) allocated channel.

Figure 9:
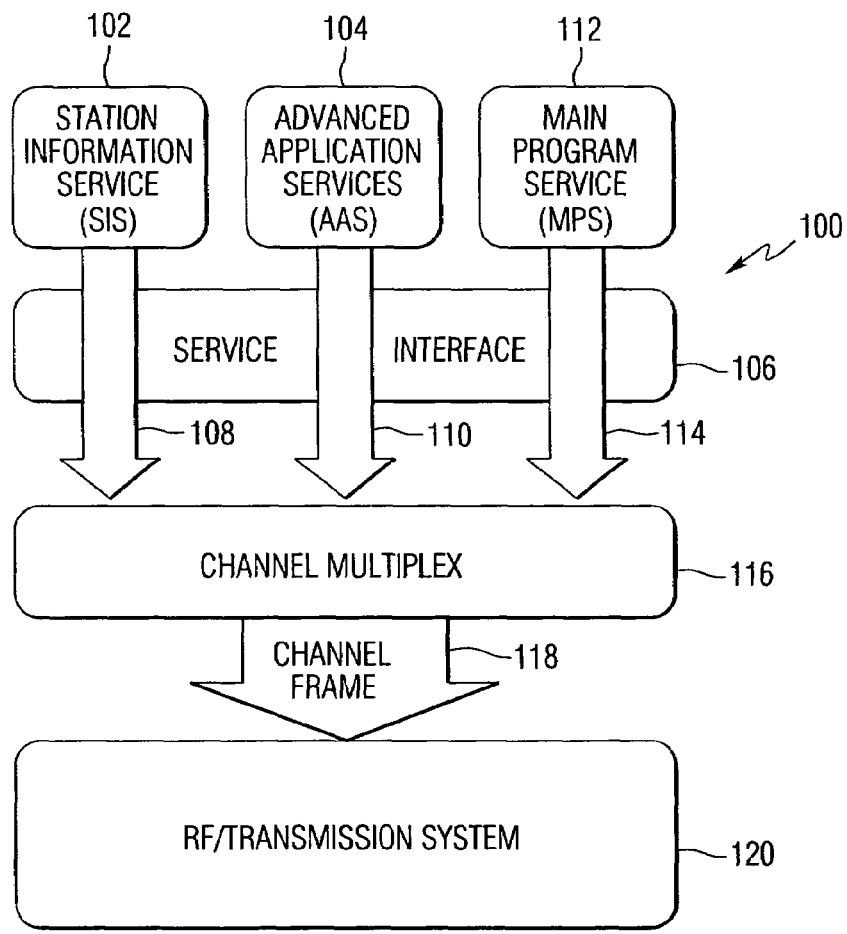
FIG. 9 is a functional block diagram of protocol stack used in a transmitter in a digital audio broadcasting system.

FIG. 9 is a functional block diagram of the signal processing protocol layers 100 of a transmitter for use in a digital audio broadcasting system. FIG. 9 illustrates how control signals and information signals are passed through the various layers of the protocol stack to generate an IBOC signal on the broadcast side.

The system can be used to provide various services including a Station Identification Service (SIS) and an Auxiliary Application Service (AAS), as illustrated by blocks 102 and 104.

A data service interface 106 receives SIS and AAS signals as illustrated by arrows 108 and 110. A main program application 112 also supplies a main program service (MPS) data signal to interface 106 as shown by arrow 114. The data service interface outputs data to a channel multiplexer 116, which produces transfer frames as illustrated by arrow 118 for use by the RF/transmission system 120.

The Main Program Service preserves the existing analog radio-programming formats in both the analog and digital transmissions. In addition, the Main Program Service can include digital data that directly correlates with the audio programming. The AM and FM systems share a common system protocol stack. FM and AM systems differ primarily in a modem/physical layer designated as Layer 1 (L1). The upper layers are common to both the AM and FM systems.

The SIS provides the necessary control and identification information that indirectly accommodates user search and selection of digital radio stations, and their supporting services. The SIS receives inputs from all other applications so that their status can be broadcast over the Primary IBOC Data Service (PIDS) L1 logical channels and/or Secondary IBOC Data Service (SIDS) L1 logical channels. The AAS allows a virtually unlimited number of custom and specialized digital applications to operate concurrently. Auxiliary applications can be added at any time in the future.

Figure 10:
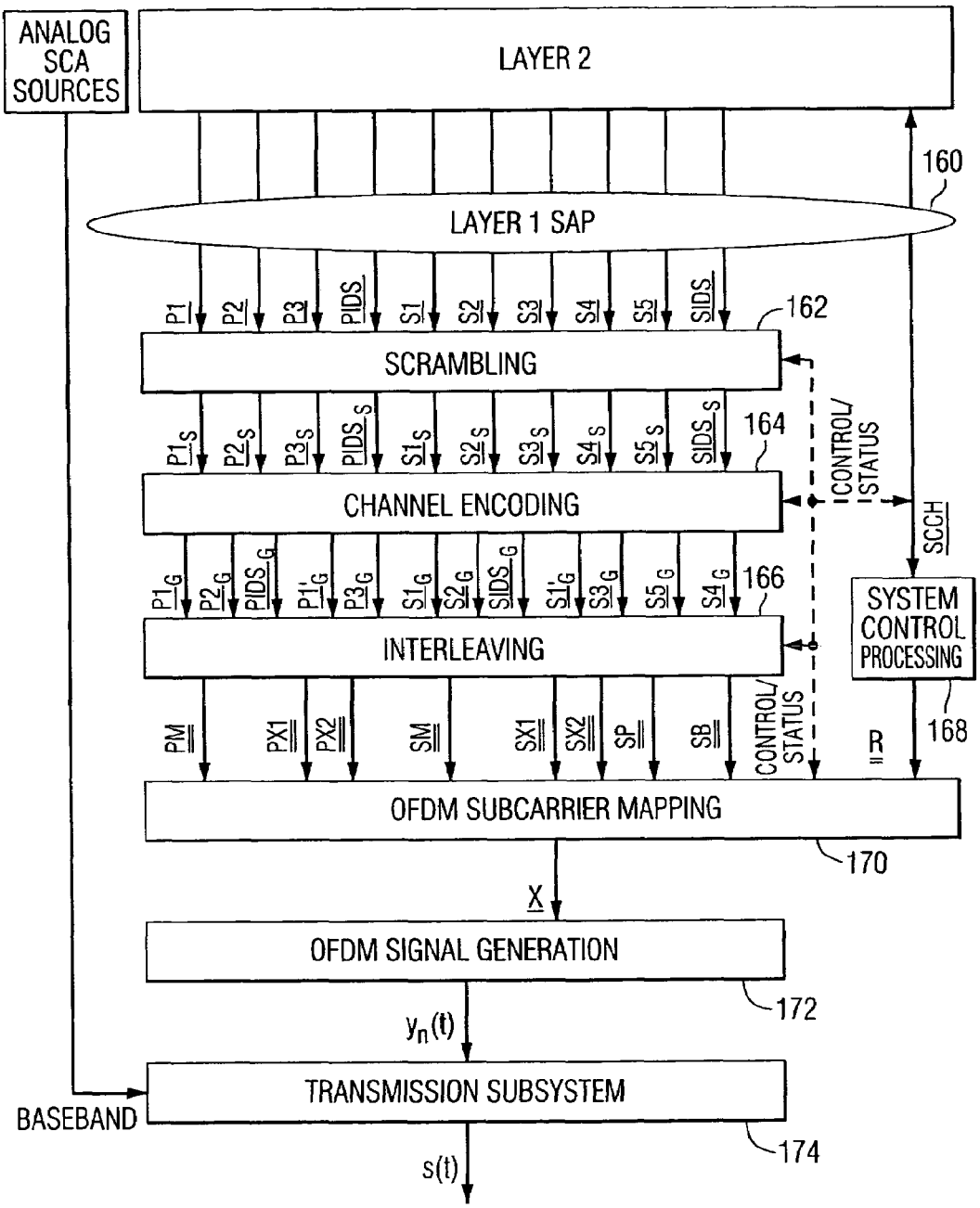
FIG. 10 is a functional block diagram of the modem/physical layer of the protocol stack used in a transmitter in a digital audio broadcasting system.

FIG. 10 is a functional block diagram of modem/physical Layer 1 processing. Audio and data are passed from the higher protocol layers to the physical layer, the modem, through a plurality of Layer 1 service access points (SAP) 160.

The L1 SAP defines the interface between Layer 2 and Layer 1 of the system protocol stack. Each channel enters Layer 1 in discrete transfer frames, with a unique size and rate determined by the service mode. Transfer frames that carry information from Layer 2 are referred to as L1 Service Data Units (SDUs).

The concept of logical channels and their function is central to the transport and transmission of data through the IBOC system. A logical channel is a signal path that conducts Layer 1 SDUs through Layer 1 with a specified grade of service. In FIG. 10 the logical channels are denoted by symbols such as P1, PIDS, S1, etc. The underscore indicates that the data in the logical channel is formatted as a vector.

Scrambling randomizes the digital data in each logical channel to "whiten" and mitigate signal periodicities when the waveform is demodulated in a conventional analog FM demodulator. The bits in each logical channel are scrambled to randomize the time-domain data and aid in receiver synchronization. Scrambling is used to prevent long streams of 1's or 0's, or periodic data patterns which could cause difficulties in the synchronization process, or unintended interference due to higher than average frequency components in the modulated signal. The scrambling is often done at the modulation level after coding. However, the scrambling in a preferred embodiment of this system is done in the logical channel prior to encoding for convenience. In this case, the information bits are scrambled, which results in a somewhat scrambled modulated signal. Another benefit of scrambling in the logical channel is that some low level of security can be employed since the receiver must know the scramble code to decode the data.

The inputs to the scramblers are the active logical channels from the L1 SAP, as selected by the service mode. The outputs of the scramblers are transfer frames of scrambled bits for each of the active logical channels. The scrambler generates a pseudorandom code which is modulo-2 summed with the input data vectors. The code generator is a linear feedback shift register.

Channel coding comprises the functions of scrambling, channel encoding, and interleaving shown in FIG. 10. Each logical channel is scrambled and encoded separately and in parallel. All parallel scramblers are identical, but operate at different rates, depending on the active service mode. Each scrambler generates a maximal-length scrambling sequence using a linear feedback shift register with primitive polynomial. A given bit of a scrambled transfer frame is generated by modulo-2 adding the associated input bit with the corresponding bit of the scrambling sequence.

Layer 1 of the FM system converts information and system control from Layer 2 (L2) into the FM waveform for transmission in the VHF band. Information and control is transported in discrete transfer frames via multiple logical channels through the Layer 1 service access point (SAP). These transfer frames are also referred to as Layer 1 service data units (SDUs).

For each frequency partition, data subcarriers d1 through d18 convey the L1 SDUs, while the reference subcarriers convey system control. Subcarriers are numbered from 0 at the center frequency to ±546 at either end of the channel frequency allocation.

The L1 SDUs vary in size and format depending on the service mode. The service mode, a major component of system control, determines the transmission characteristics of each logical channel. After assessing the requirements of candidate applications, higher protocol layers select service modes that most suitably configure the logical channels. The requirements are also the criteria for selection. They include selection between hybrid and all-digital signals, band expansions in conjunction with a hybrid signal or separately with an all-digital signal, desired acquisition robustness, content latency and desired signal quality. The plurality of logical channels reflects the inherent flexibility of the system, which supports simultaneous delivery of various classes of digital audio and data.

Layer 1 also receives system control from Layer 2 for use by the Layer 1 System Control Processor. The System Control Channel (SCCH) transports control and status information. Primary and secondary service mode control, amplitude scale factor select, and P3 interleaver select are sent from Layer 2 to Layer 1, while synchronization information is sent from Layer 1 to Layer 2.

A system control data sequence is a sequence of bits destined for each reference subcarrier representing the various system control components relayed between Layer 1 and Layer 2. Several bits of the system control data sequence designated "reserved" are controlled from layers above L1 via the primary reserved control data interface and the secondary reserved control data interface.

A service mode is a specific configuration of operating parameters specifying throughput, performance level, and selected logical channels. The service modes dictate all permissible configurations of the logical channels. There are a total of eleven service modes. The seven primary service modes are MP1, MP2, MP3, MP4, MP5, MP6, and MP7. They configure the primary logical channels. The four secondary service modes are MS1, MS2, MS3, and MS4. They configure the secondary logical channels.

A logical channel is a signal path that conducts L1 SDUs in transfer frames into Layer 1 with a specific grade of service, determined by service mode. Layer 1 of the FM air interface provides ten logical channels to higher layer protocols. Not all logical channels are used in every service mode.

There are four primary logical channels which are used with both the Hybrid and All Digital waveforms. They are denoted as P1, P2, P3, and PIDS. Table 1 shows the approximate information rate supported by each primary logical channel as a function of primary service mode.

TABLE 1

Approximate Information Rate of Primary Logical Channels

| Service Mode | Approximate Information Rate (kbits/sec) | | | | Waveform |
|---|---|---|---|---|---|
| | P1 | P2 | P3 | PIDS | |
| MP1 | 98 | N/A | N/A | 1 | Hybrid |
| MP2 | 98 | N/A | 12 | 1 | Extended Hybrid |
| MP3 | 98 | N/A | 25 | 1 | Extended Hybrid |
| MP4 | 98 | N/A | 50 | 1 | Extended Hybrid |
| MP5 | 25 | 74 | 25 | 1 | Extended Hybrid, All Digital |
| MP6 | 50 | 49 | N/A | 1 | Extended Hybrid, All Digital |
| MP7 | 25 | 98 | 25 | 1 | Extended Hybrid, All Digital |

There are six secondary logical channels that are used only with the All Digital waveform. They are denoted as S1, S2, S3, S4, S5, and SIDS. Table 2 shows the approximate information rate supported by each secondary logical channel as a function of secondary service mode.

TABLE 2

Approximate Information Rate of Secondary Logical Channels

| Service Mode | Approximate Information Rate (kbits/sec) | | | | | | Wave form |
|---|---|---|---|---|---|---|---|
| | S1 | S2 | S3 | S4 | S5 | SIDS | |
| MS1 | 0 | 0 | 0 | 98 | 6 | 1 | All Digital |
| MS2 | 25 | 74 | 25 | 0 | 6 | 1 | All Digital |
| MS3 | 50 | 49 | 0 | 0 | 6 | 1 | All Digital |
| MS4 | 25 | 98 | 25 | 0 | 6 | 1 | All Digital |

Logical channels P1 through P3 and S1 through S5 are designed to convey audio and data, while the Primary IBOC Data Service (PIDS) and Secondary IBOC Data Service (SIDS) logical channels are designed to carry IBOC Data Service (IDS) information.

The performance of each logical channel is completely described through three characterization parameters: transfer, latency, and robustness. Channel encoding, spectral mapping, interleaver depth, and diversity delay are the components of these characterization parameters. The service mode uniquely configures these components within Layer 1 for each active logical channel, thereby determining the appropriate characterization parameters. In addition, the service mode specifies the framing and synchronization of the transfer frames through each active logical channel.

Some processing stages shown in FIG. 10 are denoted by a logical channel subscript. For example, logical channel designations are subscripted with an "S" after scrambling and with a "G" after channel encoding. In addition, the primed notation (as in $\underline{P1}'_G$) indicates that the logical channel is processed differently than the "unprimed" channel and is destined for transmission in a different portion of the spectrum within the allocated bandwidth. The single underline notation for a logical channel name refers to the fact that data is passed between the various functions as vectors. Each logical channel has a dedicated scrambler and channel encoder.

The L1 SAP 160 defines the interface between Layer 2 and Layer 1 of the system protocol stack. Each channel enters Layer 1 in discrete transfer frames, with unique size and rate determined by the service mode. Transfer frames that carry information from Layer 2 are referred to as L1 SDUs.

The scrambling function, illustrated as block 162, randomizes the digital data in each logical channel to mitigate signal periodicities. At the output of the scrambling function, the logical channel vectors retain their identity, but are distinguished by the "S" subscript. (e.g., "$\underline{P1}s$").

Channel Encoding, as illustrated in block 164, uses convolutional encoding to add redundancy to the digital data in each logical channel to improve its reliability in the presence of channel impairments. Channel encoding is used to add redundancy to each of the logical channels to improve the reliability of the transmitted information. The code rate defines the increase in overhead on a coded channel resulting from channel encoding. The code rate is the ratio of information bits to the total number of bits after coding.

Convolutional encoding is a form of forward-error-correction channel encoding that inserts coding bits into a continuous stream of information bits to form a predictable structure. Unlike a block encoder, a convolutional encoder has memory, and its output is a function of current and previous inputs.

The size of the logical channel vectors is increased in inverse proportion to the code rate. The code rate defines the increase in overhead on a coded channel resulting from channel encoding. It is the ratio of information bits to the total number of bits after coding.

The encoding techniques are configurable by service mode. Diversity delay is also imposed on selected logical channels. Diversity delay provides a fixed time delay in one of two channels carrying the same information to defeat non-stationary channel impairments such as fading and impulsive noise.

At the output of the channel encoder, the logical channel vectors retain their identity, but are distinguished now by the "G" subscript (e.g., "$P1_G$"). In a few service modes, P1 and S1 are split to provide a delayed and undelayed version at the output.

Interleaving in time and frequency, as shown in block 166, is employed to mitigate the effects of burst errors. The interleaving techniques are tailored to the VHF fading environment and are configurable by service mode. The statistics of multipath fading in the VHF channel, along with adjacent channel interference affects large groups of subcarriers, for example, the upper sideband or the lower sideband, or portions of these sidebands. The interleaving results in placing code bits such that the remaining good code bits (unaffected by interference) can accommodate a reasonable good "punctured" noncatastrophic code. Furthermore, the multipath fading statistics in the typical mobile VHF channel result in fades that are selective in frequency, and vary in time at a fade rate proportional to the vehicle speed. These frequency and time fading statistics influence the interleaver time span and frequency interleaving of the code bits. The frequency interleaving is exploited in the OFDM design. This interleaving results in significantly more robust performance in the channel. In this process, the logical channels lose their identity. The interleaver output is structured in a matrix format. Each matrix is comprised of one or more logical channels and is associated with a particular portion of the transmitted spectrum. The interleaver matrix designations reflect the spectral mapping. For example, "$\underline{PM}$" maps to the Primary Main portion of the spectrum, and "$\underline{SX}1$" maps to the Secondary Extended (SX) portion of the spectrum.

System Control Processing, as illustrated in block 168, generates a matrix of system control data sequences that include control and status (such as service mode), for broadcast on the reference subcarriers. This data matrix is designated "$\underline{R}$" for "Reference."

OFDM Subcarrier Mapping, shown in block 170, assigns the interleaver matrices and the system control matrix to the OFDM subcarriers. One row of each active interleaver matrix is processed every OFDM symbol $T_s$ to produce one output vector $\underline{X}$, which is a frequency-domain representation of the signal. The mapping is specifically tailored to the non-uniform interference environment and is a function of the service mode. Some control information is needed at the receiver to enable subsequent deinterleaving and decoding in the various modes. This control information is generally not interleaved.

OFDM Signal Generation, as shown in block 172, generates the digital portion of the time-domain FM waveform. The input vectors are transformed into a shaped time-domain baseband pulse, $y_n(t)$, defining one OFDM symbol.

The Transmission Subsystem, as shown in block 174, formats the baseband waveform for transmission through the VHF channel. Major sub-functions include symbol concatenation and frequency up-conversion. In addition, when transmitting the Hybrid waveform, this function modulates the analog source and combines it with the digital signal to form a composite Hybrid signal, s(t), ready for transmission.

The Extended Hybrid waveform is created by adding Primary Extended sidebands to the Primary Main sidebands present in the Hybrid waveform, as shown in FIG. 3. Depending on the service mode, one, two, or four frequency partitions can be added to the inner edge of each Primary Main sideband.

Each Primary Main sideband includes ten frequency partitions and an additional reference subcarrier spanning subcarriers 356 through 546, or −356 through −546. The upper Primary Extended sidebands include subcarriers 337 through 355 (one frequency partition), 318 through 355 (two frequency partitions), or 280 through 355 (four frequency partitions). The lower Primary Extended sidebands include subcarriers −337 through −355 (one frequency partition), −318 through −355 (two frequency partitions), or −280 through −355 (four frequency partitions). The amplitude of each subcarrier is scaled by an amplitude scale factor. There is a match between the significance of the encoded bits and the partitions assumed to be more subjected to impairments. So more significant code bits are located in the more protected partitions.

The All Digital waveform is constructed by disabling the analog signal, fully expanding the bandwidth of the primary digital sidebands, and adding lower-power secondary sidebands in the spectrum vacated by the analog signal. The spectrum of the All Digital waveform is shown in FIG. 4.

The System Control Channel (SCCH) passes discrete transfer frames of control and status information between Layer 2 and Layer 1. The control information, passed from Layer 2 to Layer 1, includes Primary Service Mode Control (PSM), Secondary Service Mode Control (SSM), and Amplitude Scale Factor Select (ASF). Status information passed from Layer 2 to Layer 1 is the P3 Interleaver Select (P3IS) (for Extended Hybrid and All Digital waveforms only). The status information passed from Layer 1 to Layer 2 consists of Absolute L1 Frame Number (ALFN) and L1 Block Count (BC). In addition, several bits of the system control data sequence designated "reserved" are controlled from layers above L1 via the primary reserved control data interface and the secondary reserved control data interface. This status information and the L1 block count and indicators of the state of the control information (with the exception of ALFN) is broadcast on the reference subcarriers.

The service mode dictates the configuration and performance of the logical channels. There are two basic types of service modes: primary, which configures primary logical channels, and secondary, which configures secondary logical channels.

All waveforms require the definition of both primary and secondary service modes. If secondary sidebands are not present, the secondary service mode is set to "None". In one embodiment of the system, a total of eleven service modes support the delivery of various combinations and classes of digital audio and data.

The active primary service modes (PSMs) are designated as MP1, MP2, MP3, MP4, MP5, MP6, and MP7. The active secondary service modes (SSMs) are designated as MS1, MS2, MS3, and MS4.

The Primary Service Mode provides backward compatibility. Backward compatibility ensures that any new modes of operation still carry the Primary Service mode that can be decoded by any receiver. Primary service mode bit assignments greater than binary 000110 are reserved for future expansion. However, to ensure backward compatibility, all reserved primary service modes must maintain backward compatibility with one of the service modes MP1-MP6. As a minimum, backward compatibility includes the PIDS logical channel, the system control data sequence (matrix $\underline{R}$) conveyed over the reference subcarriers, and at least one logical channel which can support medium quality digital audio. Any service mode that is backward compatible with hybrid service modes MP1-MP4 is also a hybrid service mode and the secondary service mode must be set to "None".

A primary service mode may maintain backward compatibility with primary service modes MP5 and MP6 in one of two configurations. Both the P1 and P1' or only the P1' logical channels may be supported.

When broadcasting secondary sidebands in the All Digital waveform, active primary and secondary service modes are both required. Service modes MP1 through MP4 are invalid for the All Digital waveform. Only primary service modes MP5 through MP7 may be paired with secondary service modes MS1 through MS4 when broadcasting the All Digital waveform. Any combination of these primary and secondary service modes is allowable.

Primary service mode control (PSM) and secondary service mode control (SSM) are received from Layer 2 via the SCCH at the rate $R_f$. Service mode changes are invoked only on an L1 frame boundary. However, not all service mode changes can be effected seamlessly (without disruption of Layer 1 service).

In service modes MP2-MP5 and MP7, the P3 logical channel may utilize either a short or long interleaver depth (time span). The long interleaver depth is more robust than the short interleaver depth. However, the long interleaver (about 1.48 seconds) results in a long decode time which affects receiver tuning time before audio can be heard. This long tuning time is unacceptable in some cases, so a short interleaver is used.

Long or short interleaver is a relative term, in regards to the PDU length. A short interleaver encapsulates an amount of bits of a signal PDU, while a long interleaver can encapsulate bits from several consecutive PDUs. The length of the long interleaver is a parameter. There is a tradeoff between robustness and content availability delay. If delay is considered, at a time by a specific user for a specific case, to be the more important factor, then a short interleaver may be selected, resulting in limited robustness. If robustness is considered, under a given time and content combination, to be the more important factor, then a long interleaver may be selected.

P3 Interleaver Select (P3IS) is received from L2 via the SCCH. When the system is transmitting in service modes MP1 or MP7 this bit is ignored by L1. When the state of P3IS changes (as detected on an L1 frame boundary) while transmitting in service mode MP2-MP5 or MP7, there will be a discontinuity in the transmission of the P3 logical channel. Changes in the state of P3IS do not affect the operation of any other logical channel.

The transmitted signal may be regarded as a series of unique L1 frames of duration $T_f$. A transfer frame is an ordered, one-dimensional collection of data bits of specified length originating in Layer 2, grouped for processing through a logical channel. In order to reference all transmissions to absolute time, each L1 frame is associated with an Absolute L1 Frame Number (ALFN). This universal frame numbering scheme assumes that the start of ALFN 0 occurred at 00:00:00 Universal Time Coordinated (UTC) on Jan. 6, 1980. The start of every subsequent L1 frame occurs at an exact integer multiple of $T_f$ after that instant in time. The current ALFN can be a binary number determined by subtracting the GPS start time (00:00:00 on Jan. 6, 1980) from the current GPS time (making allowance for the GPS epoch), expressing the difference in seconds, and multiplying the result by the frame rate, $R_f$. A new GPS epoch starts every 1024 weeks. The second epoch began at midnight between Aug. 21 and Aug. 22, 1999.

The ALFN, which is passed to Layer 2 via the SCCH at the rate $R_f$, is used to schedule the delivery of time-critical programming. It is not broadcast as part of the transmitted signal.

Each L1 frame may be considered to include sixteen L1 blocks of duration $T_b$. The L1 Block Count (BC) indicates the position of the current L1 block within the L1 frame. An L1 block count of 0 signifies the start of an L1 frame, while a BC of 15 designates the final L1 block in an L1 frame.

The BC is passed to Layer 2 via the SCCH at the rate $R_b$. It is broadcast on the reference subcarriers and is used by the receiver to aid in synchronization.

Figure 11:
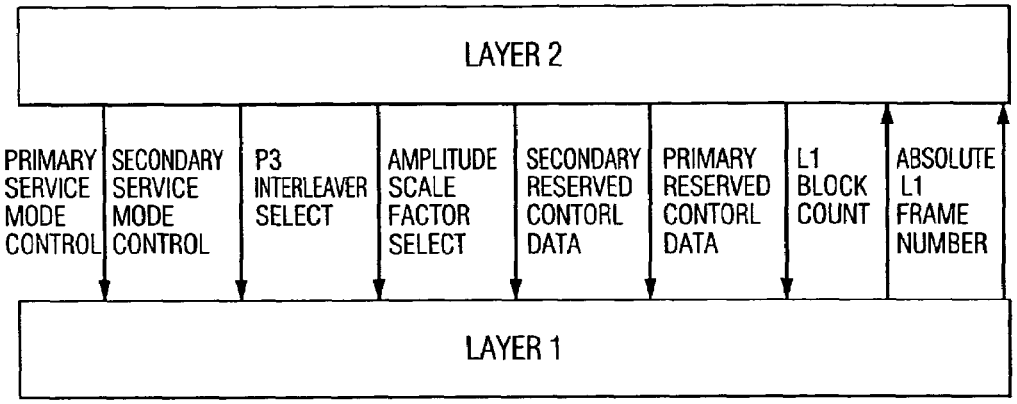
FIG. 11 is a schematic representation of an interface between layers of a protocol stack used in a transmitter in a digital audio broadcasting system.

An illustration of the relationship of L1 blocks to L1 frames is shown in FIG. 11. The primary sidebands and secondary sidebands are independently scaled in amplitude. The primary sideband scale factors, $a_0$ and $a_1$, are fixed scale factors determined by the choice of service mode. One of four amplitude scale factors, $a_2$ through $a_5$, is selected by a broadcaster for application to all of the secondary sidebands. The secondary sideband amplitude scale factor selection (ASF) is received from L2 via the SCCH. When transmitting the Hybrid or Extended Hybrid waveform, this field is ignored. When transmitting the All Digital waveform, changes to ASF can be effected seamlessly at an L1 frame boundary without discontinuity or disruption in Layer 1 service.

The primary system control data sequence contains three bits designated reserved and the secondary system control data sequence contains six bits designated reserved. These bits are controlled by layers above L1 via the primary reserved control data interface and the secondary reserved control data interface.

A logical channel is a signal path that conducts L1 SDUs through Layer 1 with a specified grade of service. The primary logical channels are P1, P2, P3, and PIDS. The secondary logical channels are S1, S2, S3, S4, S5, and SIDS. Logical channels are defined by their characterization parameters and configured by the service mode.

For a given service mode, the grade of service of a particular logical channel may be uniquely quantified using three characterization parameters: transfer, latency, and robustness. Channel code rate, interleaver depth, diversity delay, and spectral mapping are the determinants of the characterization parameters.

Transfer defines the throughput of a logical channel. The block-oriented operations of Layer 1 (such as interleaving) require that it process data in discrete transfer frames, rather than continuous streams. As a result, throughput is defined in terms of transfer frame size (in bits) and transfer frame rate (in Hz, or the number of transfer frames per second). This Layer 1 framing effectively defines the alignment of L1 SDUs.

Each transfer frame is uniquely identified by its transfer frame number $F_{m1:m2}^{n}$, where n is the ALFN with which the transfer frame is associated, and m1:m2 is the BC range that is spanned by the transfer frame within L1 frame n. Thus, the BC range indicates the position of the transfer frame within the L1 frame. The transfer frame number is not broadcast as part of the transmitted HD Radio signal.

All transfer frames are conducted through Layer 1 at one of three rates:

the L1 frame rate, $$R_f = \frac{1}{T_f}$$

the L1 block rate, $$R_b = \frac{1}{T_b}$$

the L1 block pair rate, $$R_p = \frac{1}{T_p}$$

Figure 12:
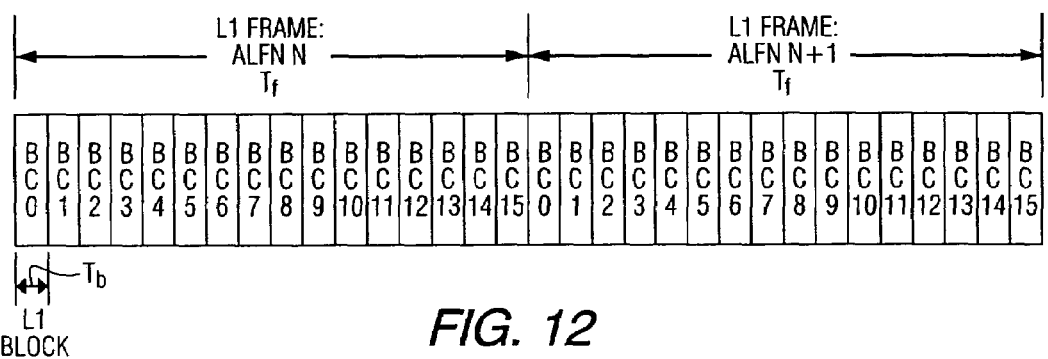
FIG. 12 is a schematic representation of a modem frame in a DAB signal.

The ratio of the transfer frame rate to the L1 frame rate is termed the transfer frame modulus. For a transfer frame modulus of 1, the BC range is always 0:15. For a transfer frame modulus of 16, the BC range is always a single integer between 0 and 15. Signal transfer between Layer 2 and Layer 1 is illustrated in FIG. 11. The transfer frame rate relationships are illustrated in FIG. 12.

Figure 13:
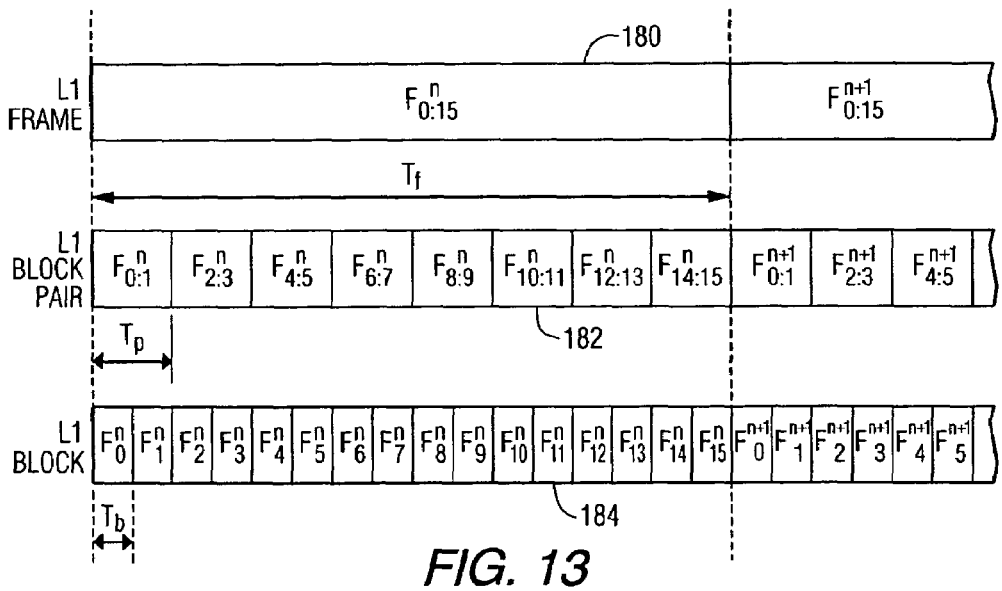
FIG. 13 is a schematic representation of various modem frames in a DAB signal.
Figure 14:
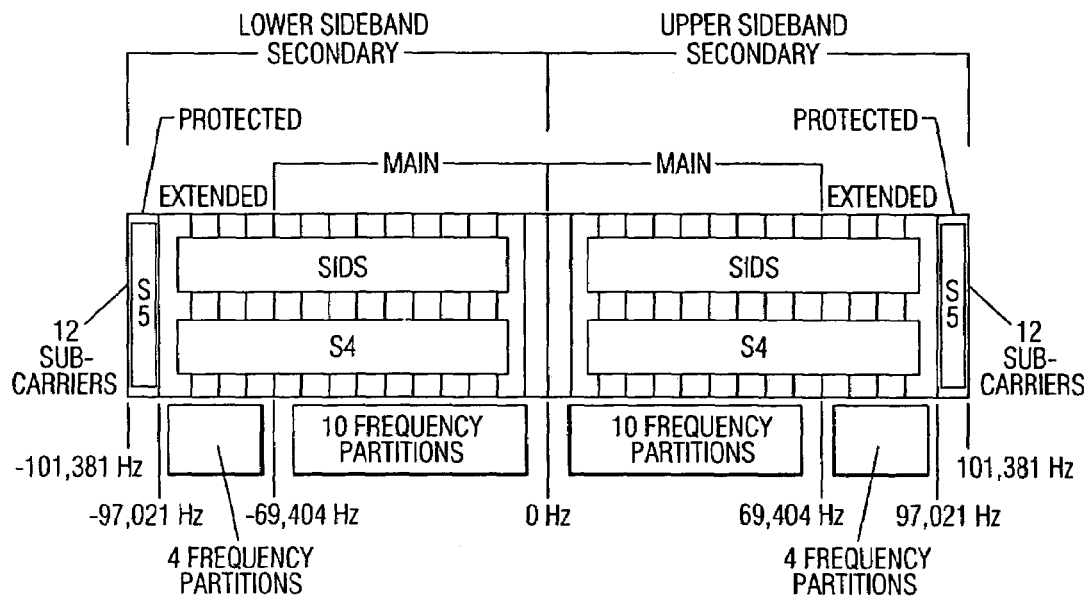
FIGS. 14, 15, 16 and 17 are schematic representations of the secondary subcarriers in an all-digital DAB signal.
Figure 15:
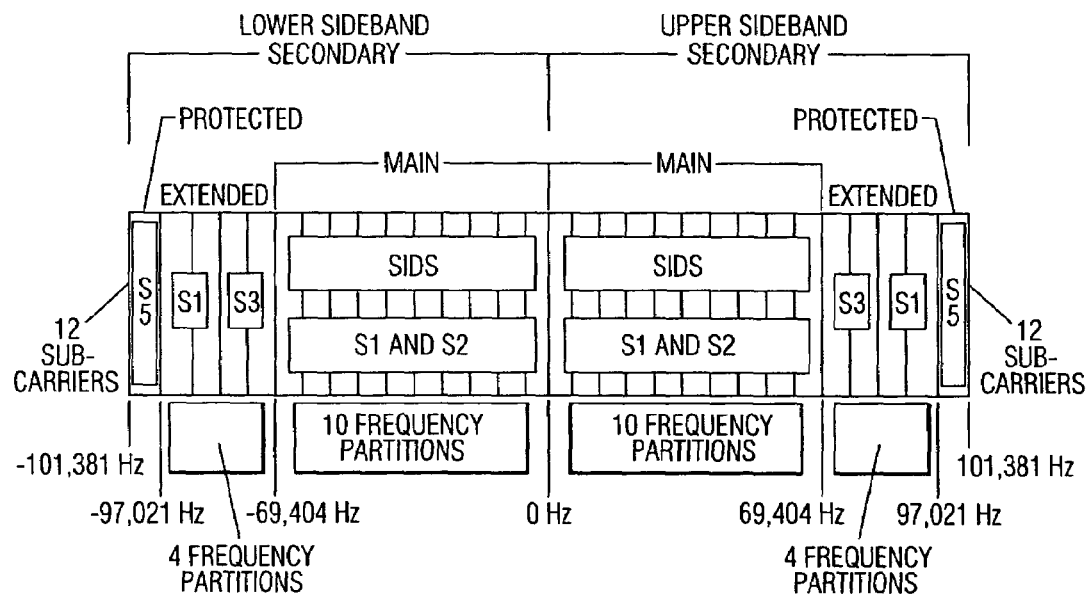
Figure 16:
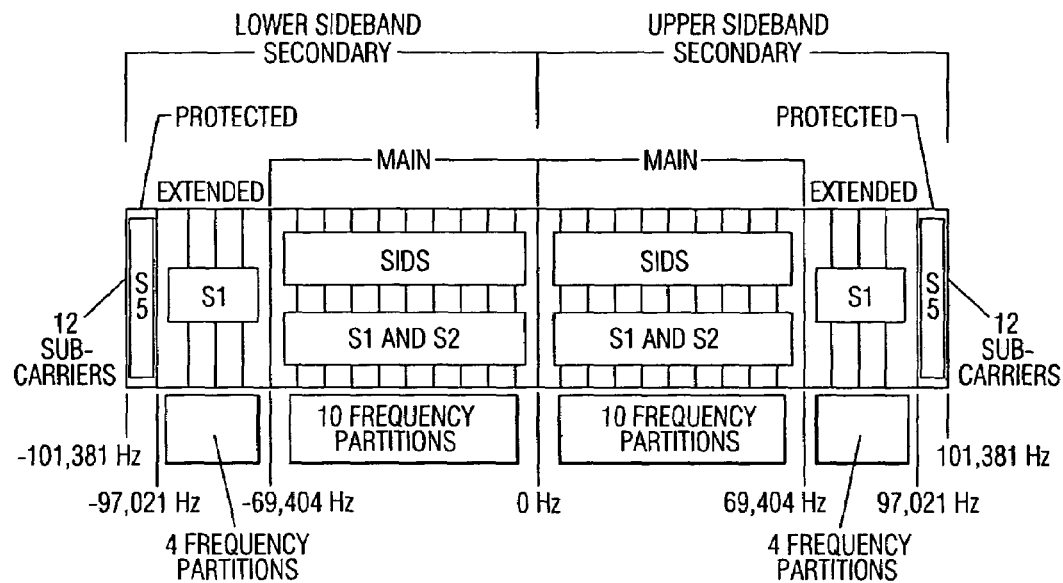
Figure 17:
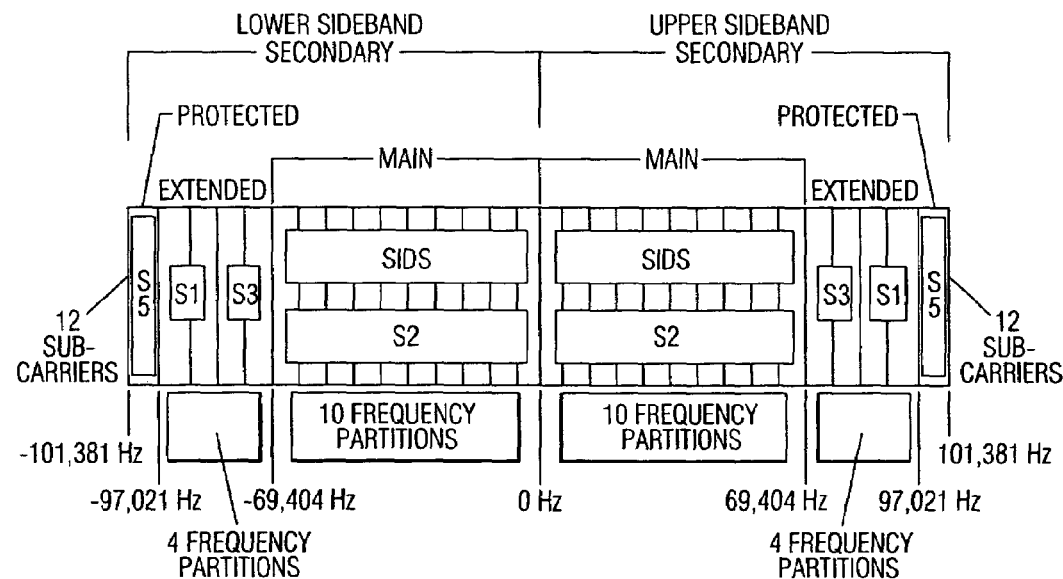

FIG. 13 illustrates an undivided transfer frame 180, a transfer frame 182 divided into block pairs, and a transfer frame 184 divided into blocks.

Spectral mapping and channel code rate determine the transfer of a logical channel, since spectral mapping limits capacity and coding overhead limits information throughput. Interleaver depth is also a factor, because transfer frames are normally conducted through Layer 1 at rates corresponding to the interleaver depth of their logical channel.

Latency is the delay that a logical channel imposes on a transfer frame as it traverses Layer 1. The latency of a logical channel is defined as the sum of its interleaver depth and diversity delay. It does not include processing delays in Layer 1, nor does it include delays imposed in upper layers.

The interleaver depth determines the amount of delay imposed on a logical channel by an interleaver. One embodiment of the system employs three interleaver depths: L1 block, L1 block pair, and L1 frame. Diversity delay is also employed on some logical channels.

Higher layers assign information to logical channels with the requisite latency through service mode selection. Six latencies are specified for the system.

Robustness is the ability of a logical channel to withstand channel impairments such as noise, interference, and fading. There are eleven relative levels of robustness in Layer 1 of the FM air interface. A robustness of 1 indicates a very high level of resistance to channel impairments, while a robustness of 11 indicates a lower tolerance for channel-induced errors. As with latency, Layer 2 must determine the required robustness of a logical channel before selecting a service mode.

Spectral mapping, channel code rate, interleaver depth, and diversity delay determine the robustness of a logical channel. Spectral mapping affects robustness by setting the relative power level, spectral interference protection, and frequency diversity of a logical channel. Channel coding increases robustness by introducing redundancy into the logical channel. Interleaver depth influences performance in multipath fading, thereby affecting the robustness of the logical channel. Finally, some logical channels in certain service modes delay transfer frames by a fixed duration to realize time diversity. This diversity delay also affects robustness, since it mitigates the effects of the mobile radio channel.

Information throughput of a logical channel at the L1 SAP can be calculated using these tables and the following formula:

throughput (bits/*sec*)=transfer frame size (bits)·transfer frame rate (*Hz*)

For a given service mode, each logical channel is applied to a group of OFDM subcarriers or frequency partitions, as illustrated in FIGS. 14-17. In these figures, the annotated frequencies represent offsets from the channel center frequency.

The logical channels share a common, absolute time reference, so that all transfer frames are precisely aligned as they enter the L1 SAP. Each transfer frame is assigned a unique transfer frame number $F_{m1:m2}{}^n$, where n is the ALFN, and m1:m2 is the BC range that designates the position of the transfer frame within the indexed L1 frame. This numbering scheme allows all transfer frames to be referenced to an absolute transmission time.

Figure 18:
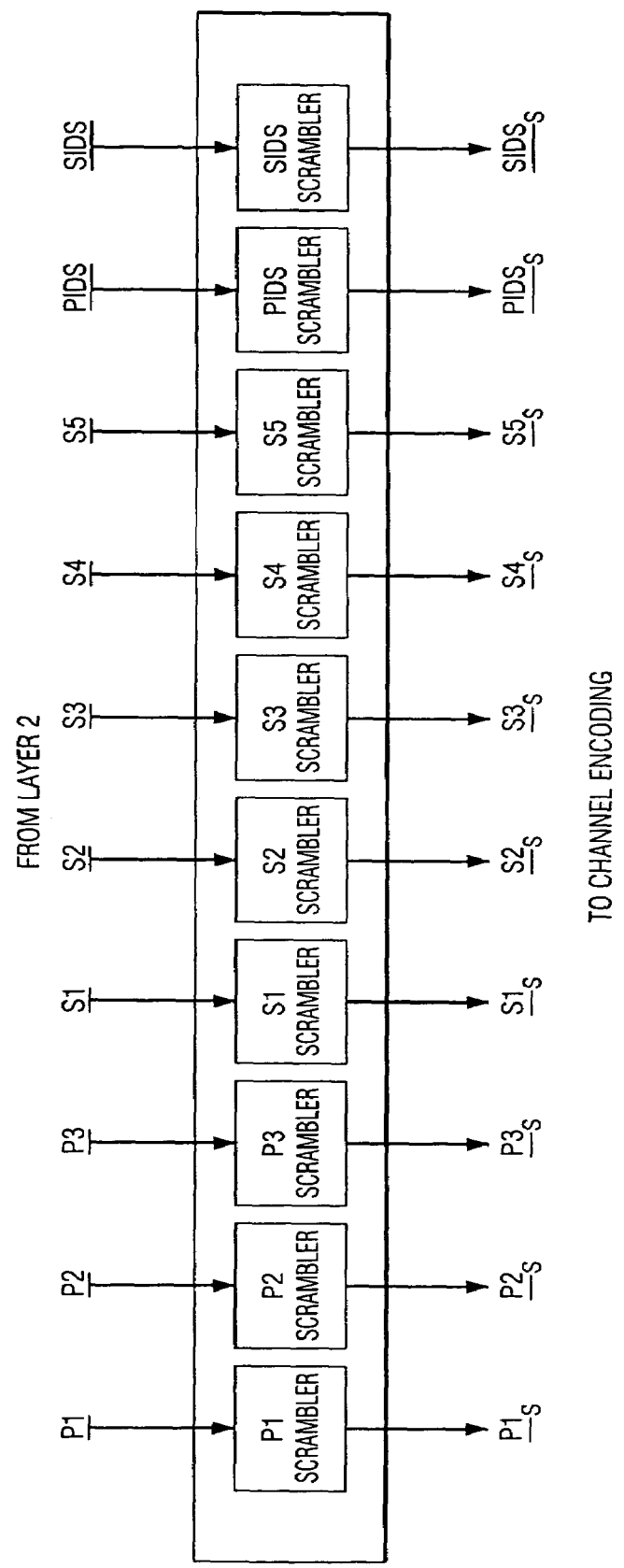
FIG. 18 is a functional block diagram of a scrambler.
Figure 19:
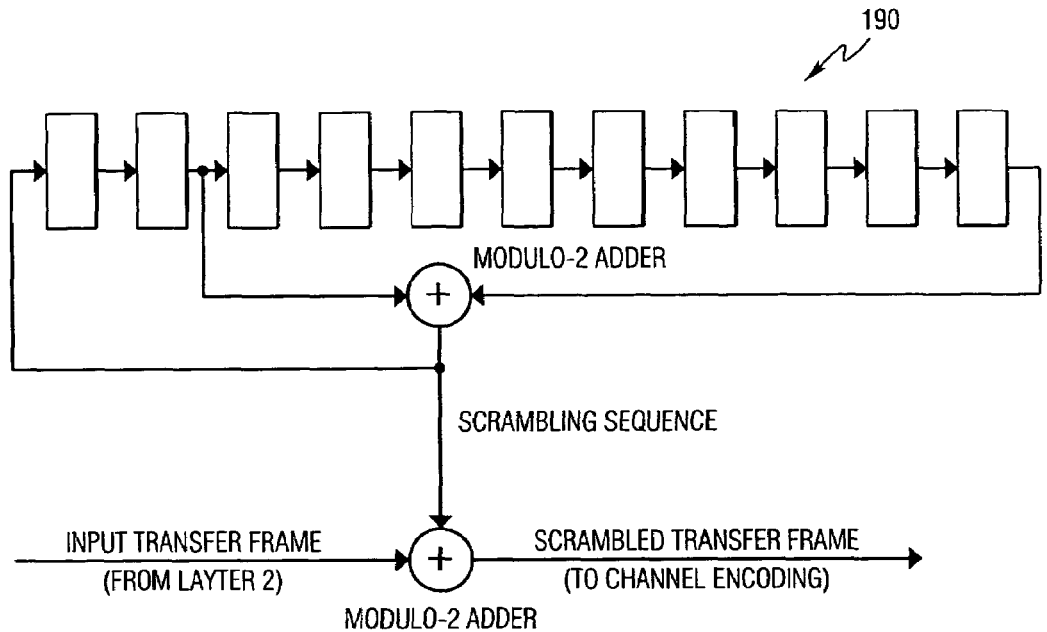
FIG. 19 is a schematic diagram of a scrambler.
Figure 20:
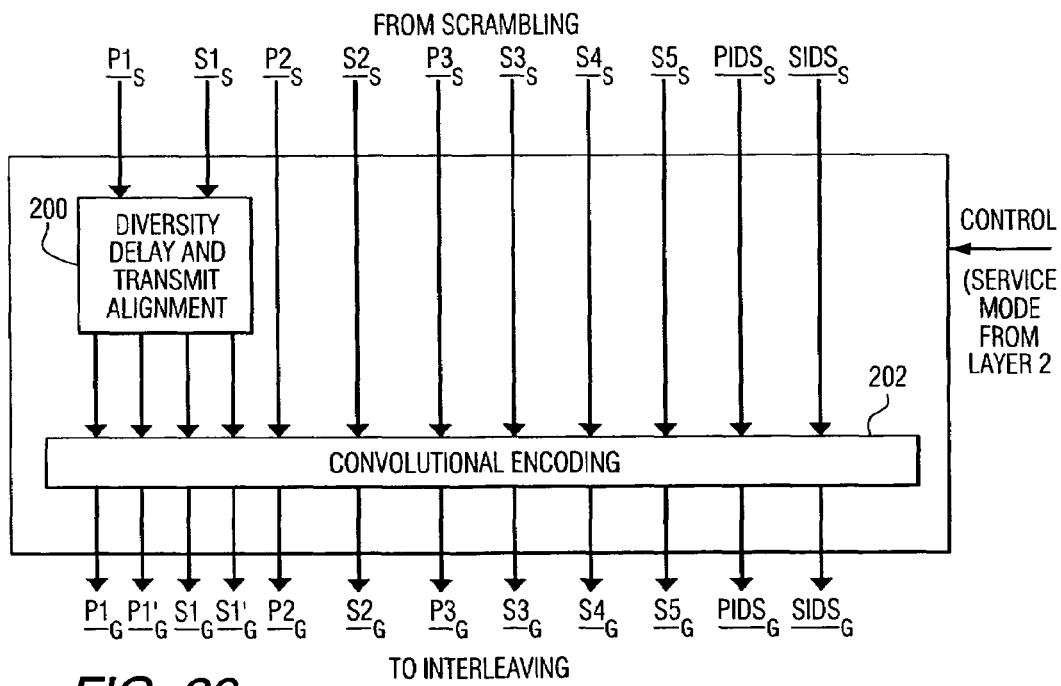
FIG. 20 is a functional block diagram of an encoder.

FIG. 18 through FIG. 20 show the timing and alignment of all transfer frames received at the L1 SAP for each service mode. The diagrams illustrate that, depending on the service mode, logical channels carry information in transfer frames of varying duration: L1 frame ($T_f$), L1 block-pair ($T_p$), or L1 block ($T_b$). Each diagram spans several L1 frames, around an arbitrary L1 frame boundary at ALFN n. At each L1 frame boundary, the transfer frames are precisely aligned. The Layer 1 service access point (SAP) is a parameterized conceptual interface between Layer 2 and Layer 1 that is common to both the AM and FM systems. It serves to aid the understanding of the structure of the protocol stack. It does not imply a specific implementation, but rather provides a formal definition of the services that flow between Layer 1 and Layer 2, and their use.

The SAP is described using primitives. Each primitive describes the exchange of a particular type of information (control and/or user content) with a specific L1 Logical Channel or with L1 itself. L2 user content, to be delivered unaltered to the receiver entity, is called a service data unit or SDU. SDUs are requested by L1 using an IND (Indication) primitive asserted by L1. L2 responds with a RESP (Response) primitive carrying the data requested. Other exchanges between Layer 1 and Layer 2 are control information, and may or may not be transmitted as part of the waveform.

The bits in each logical channel are scrambled to randomize the time-domain data and aid in receiver synchronization. As shown in FIG. 18, there are ten parallel scramblers, one for each logical channel.

The inputs to the scramblers are the active logical channels from the L1 SAP, as selected by the service mode. These inputs are delivered in discrete transfer frames. The outputs of the scramblers are transfer frames of scrambled bits for each of the active logical channels. These transfer frames are passed to the channel encoding process for forward error correction.

All parallel scramblers are identical, but operate at different rates, depending on the active service mode. A schematic diagram of the scrambler is shown in FIG. 19. Each scrambler generates a maximal-length scrambling sequence using a linear feedback shift register 190 with primitive polynomial $P(x)=1 \oplus x^2 \oplus x^{11}$. A given bit of a scrambled transfer frame is generated by modulo-2 adding the associated input bit with the corresponding bit of the scrambling sequence.

The first bit of a scrambled transfer frame is generated by modulo-2 adding the first bit of the input transfer frame with the scrambling bit generated when the shift register is set to the initial state. The process then continues until the last bit of the input transfer frame is scrambled.

Channel encoding improves system performance by increasing the robustness of the signal in the presence of channel impairments. As shown in FIG. 20, the channel encoding process is characterized by two main operations: time delay 200 (for diversity delay and transmit alignment) and convolutional encoding 202.

The inputs to the channel encoding process are transfer frames of scrambled bits carried through the active logical channels. The outputs of the channel encoding process are transfer frames of encoded bits associated with each of the active logical channels. The output transfer frames are passed to the interleaving function.

In the ensuing sections, for notational convenience, the logical channel vectors at a particular stage of processing are represented in shorthand notation by their subscript.

Depending on the service mode, logical channels P1 and S1 may be split into two channels and delayed as they enter the channel encoding process. The delay provides time diversity to the affected logical channels. If applied, the value of the diversity delay is fixed at $N_{dd} \cdot T_f$, where $N_{dd}$ is the number of transfer frames and $T_f$ is the duration of a transfer frame. An additional delay called Transmit Alignment is imposed on the diversity delayed signals to ensure that the delayed channels (P1' and S1') are precisely positioned in time relative to the un-delayed channels (P1 and S1) with the same content to accommodate diversity combining in the receiver.

Convolutional encoding includes three primary operations: mother code generation, puncturing, and parallel-to-serial conversion. Each of these operations is described below.

A convolutional encoder employs select generator polynomials to form a group of mother codes.

A rate $\frac{1}{n}$ convolutional encoder outputs n encoded bits $g_{h,i}$ for every input bit $s_i$, i=0, 1, . . . , N−1 in $\underline{S}$, creating a codeword matrix $\underline{\underline{G}}$ of dimension n×N:

$$\underline{\underline{G}} = \begin{bmatrix} g_{1,0} & g_{1,1} & \cdots & g_{1,N-1} \\ g_{2,0} & g_{2,1} & \cdots & g_{2,N-1} \\ \vdots & \vdots & \vdots & \vdots \\ g_{n,0} & g_{n,1} & \cdots & g_{n,N-1} \end{bmatrix}$$

where N is the length of $\underline{S}$, and h=1, 2, . . . , n indexes the codeword bits for a given input bit. In the FM system, n=3 or 4. Each column of $\underline{\underline{G}}$ represents the encoded output for a given input bit.

Some service modes require puncturing of a mother codeword to produce a slightly higher code rate, thereby allowing a higher information rate through the same physical bandwidth. The codeword matrix $\underline{\underline{G}}$ is punctured over a puncture period P. For every P encoded bits, certain bits $g_{h,i}$ are not transmitted. A puncture matrix spanning the encoded bits over a puncture period defines which encoded bits are transmitted. Repeating the puncture matrix over all encoded bits of a transfer frame forms the puncture pattern.

After the mother code bits are appropriately punctured, the parallel-to-serial converter multiplexes them by concatenating the columns of $\underline{\underline{G}}$ into a single vector $\underline{G}$ as follows:

$$\underline{G} = [g_{1,0}, g_{2,0}, \ldots, g_{n,0}, g_{1,1}, g_{2,1}, \ldots, g_{n,1}, \ldots, g_{1,N-1}, g_{2,N-1}, \ldots, g_{n,N-1}]$$

Another serial encoded bit sequence can be:

$$G32 \ [g_{1,0} \ g_{2,0} g_{3,0} g_{1,1} g_{2,1} g_{1,2} g_{2,2} g_{3,2} g_{1,3} g_{2,3}, \ldots$$
$$g_{1,N-2} g_{2,N-2} g_{3,N-2} g_{1,N-1} g_{2,N-1}]$$

The last 6 bits of a given transfer frame are used to initialize the delay elements of the corresponding convolutional encoder for that transfer frame. The use of transfer frames that define the encoding blocks is important in maintaining alignment between different logical channels.

The channel encoding process for each logical channel in each service mode is specified below. In Service Mode MP1 only P1 and PIDS logical channels are active. Only P1, P3, and PIDS logical channels are active in service modes MP2, MP3, and MP4.

Only P1, P2, P3, and PIDS logical channels are active in service mode MP5. Only P1, P2, and PIDS logical channels are active in service mode MP6. Only P1, P2, P3, and PIDS logical channels are active in service mode MP7. Only S4, S5, and SIDS logical channels are active in service mode MS1. Only S1, S2, S3, S5, and SIDS logical channels are active in service mode MS2. Only S1, S2, S5, and SIDS logical channels are active in service mode MS3. Only S1, S2, S3, S5, and SIDS logical channels are active in service mode MS4.

Figure 21:
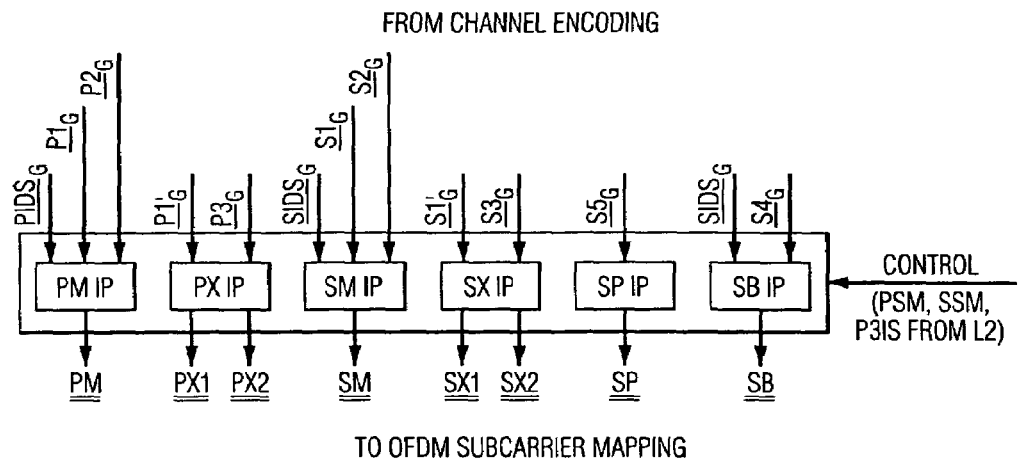
FIG. 21 is a functional block diagram of a scrambler.

Interleaving is comprised of six parallel interleaving processes (IPs): PM, PX, SM, SX, SP, and SB, shown in FIG. 21. An IP contains one or more interleavers, and, in some cases, a transfer frame multiplexer. The interleaving process (IP) is a series of manipulations performed on one or more coded transfer frames (vectors) to reorder their bits into one or more interleaver matrices whose contents are destined for a particular portion of the transmitted spectrum.

The service mode determines which inputs and IPs are active at any given time. In addition, for those service modes where the P3 logical channel is active, the P3IS control bit obtained from L2 determines whether a long or short interleaver is employed. The universe of inputs for interleaving are the channel-encoded transfer frames from the primary logical channels P1 through P3 and PIDS, and the secondary logical channels S1 through S5 and SIDS.

Interleaver matrices of bits from all active parallel IPs are transferred to OFDM Subcarrier Mapping, which maps a row of bits from each interleaver matrix to its respective upper and lower sidebands.

An interleaver is a function that takes a vector of bits as its input, and outputs a matrix of reordered bits. The reordering of bits before transmission mitigates the impact of burst errors caused by signal fades and interference.

The interleaver function uses a two-dimensional matrix to reorder a vector of channel-encoded bits. The interleaver allows individual encoded bits or groups of encoded bits to be directed to a specific interleaver partition within the interleaver matrix. An interleaver partition can be viewed as a smaller independent interleaver.

Figure 22:
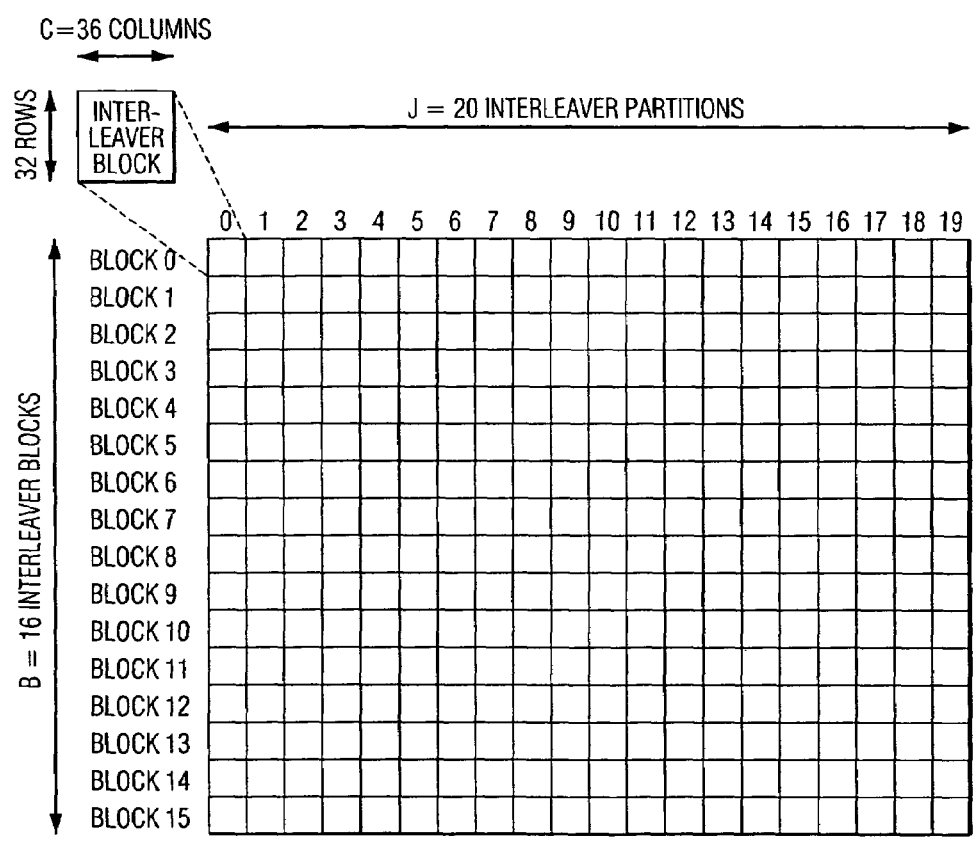
FIG. 22 is a schematic representation of an interleaver matrix.

FIG. 22 shows an interleaver matrix used by the PM IP. This interleaver matrix contains 20 interleaver partitions. In general, the interleaver matrix is divided into J interleaver partitions. Each interleaver partition is divided into B interleaver blocks. An interleaver block spans 32 rows and C columns. Thus the dimensions for each interleaver partition in a given interleaver matrix are (B·32)×C. For a given interleaver within an IP, the interleaver matrix size can vary with service mode. An interleaver partition is a logical subdivision of the overall interleaver matrix. Each interleaver partition contains C columns (C=24 or 36) and 32·B rows where B is the number of interleaver blocks.

The input to each interleaver is a vector of channel encoded bits indexed from i=0, 1, . . . , N−1. The output of each interleaver is a (B·32)×(J·C) matrix of bits destined for OFDM Subcarrier Mapping.

The mapping of each encoded bit to a location in the interleaver matrix is calculated using a set of equations. In one embodiment of a digital broadcasting system that can include this invention, there are four types of interleavers that are used to process signals in the various channels.

This invention relates to a convolutional interleaver that provides one of the interleaver functions in the DAB system. The interleaver equation set for the convolutional interleaver is set forth below. Table 3 identifies the various parameters of the convolutional interleaver equations.

TABLE 3

Interleaver Parameters

| Interleaver Parameter | Interleaver Parameter Definition |
|---|---|
| J | The number of interleaver partitions per interleaver matrix. |
| B | The number of interleaver blocks per interleaver partition. |
| C | The number of columns per interleaver block. |
| M | Factor used in interleaver partition assignment calculation. |
| $\underline{v}$ | Partition assignment vector used to control the relative ordering of interleaver partitions in the interleaver matrix. |
| B | Number of bits per transfer frame |
| N | The number of bits per interleaver input sequence. May span multiple transfer frames. |

With a convolutional interleaver, each write to the interleaver matrix must be followed by a read from the interleaver matrix. Since the total number of bits being interleaved is greater than the transfer frame size, an additional matrix is needed to manage this flow. Thus, the terminology associated with the convolutional interleaver is as follows:

Internal interleaver matrix—The interleaver matrix of dimension (B·32)×(J·C) to which bits are written using the interleaver equation set, and from which bits are read sequentially across rows. It may take multiple transfer frames to fill this matrix. It is full after N bits have been processed.

Output interleaver matrix—A matrix of dimension $$\left(\left\lceil\frac{\frac{B}{N}\cdot 32}{b}\right\rceil\right)\times(J\cdot C)$$

containing b interleaved bits read from the internal interleaver matrix. The number of bits in this matrix is equal to the size of the input transfer frame or parameter b. Bits are written to this matrix sequentially across rows starting at row 0, column 0. Note that the number of transfer frames per interleaver matrix equals N/b.

For a given convolutional interleaver, the steps needed to process each encoded bit of an input sequence of length N are as follows:

1. Assign values to parameters J, B, C, M, $\underline{v}$, b, and N using Tables 4 and 5 set forth below.
2. Initialize the partition assignment counter vector, $\underline{pt}$, to all zeros. The length of this vector equals J.
3. For each i=0 to N−1, Write a bit to the internal interleaver matrix using a calculated bit address based on the equations set forth below. Calculate partition$_i$, fetch $\underline{pt}$[partition$_i$], and calculate blocks$_i$, row$_i$, and column$_i$. Write the $i^{th}$ input bit to this location in the internal interleaver matrix.

Read a bit from the following row and column of the internal interleaver matrix:

readRow=$INT(i\ MOD\ C)$ readColumn=$i\ MOD\ C$

Write the bit read from the internal interleaver matrix to the following row and column of the output interleaver matrix:

writeRow=$INT((i\ MOD\ b)MOD\ C)$ writeColumn=$(i\ MOD\ b)MOD\ C$

Increment $\underline{pt}[\text{partition}_i]$.

The interleaver equations are set forth below. The interleaver of this invention can be used by the PX IP when P3IS=1 to interleave $\underline{P3}_G$ transfer frames. To implement the invention, first define a supporting parameter which represents the number of bits in an interleaver block:

$Bk\_bits = 32 \cdot C$

Then define a second supporting parameter:

$Bk\_adj = 32 \cdot C - 1$

An index into $\underline{v}$ can be computed to retrieve the interleaver partition assignment using:

$$partIndex_i = INT\left(\frac{i + \left(2 \cdot INT\left(\frac{M}{4}\right)\right)}{M}\right) MOD\ J$$

$\text{partition}_i = \underline{v}[partIndex_i]$

A vector of partition assignment counters, $\underline{pt}$, can be assigned with each counter having a length equal to the number of partitions. The appropriate counter for $\text{partition}_i$ is then:

$pt_i = pt\,[\text{partition}_i]$

The partition assignment counter for a given partition is incremented each time an allocation is made to that partition. The initial value of each of the partition assignment counters is set to 0.

Using the applicable parameters, a Block Assignment within the Interleaver Partition is determined by applying the following equation:

$$block_i = \left(pt_i + (\text{partition}_i \cdot 7) - \left(Bk\_adj \cdot INT\left(\frac{pt_i}{Bk\_bits}\right)\right)\right) MOD\ B$$

The Row Assignment within the interleaver block is determined by using the applicable parameters, apply the following equation:

$$row_i = INT\left(\frac{(11 \cdot pt_i\ MOD\ Bk\_bits)}{C}\right)$$

The Column Assignment within the interleaver block is determined using the applicable parameters, apply the following equation:

$column_i = (pt_i \cdot 11) MOD\ C$

The Primary Main Interleaving Process (IP) interleaves the bits mapped to the Primary Main sidebands depicted in FIG. 2 through FIG. 4. This IP is active in all primary service modes (MP1 through MP7). The PM IP disperses multiple logical channels into a single interleaver matrix, PM.

The interleaving process must maintain a specific transfer frame alignment and synchronization at its output. For a given logical channel, the BC range m1:m2 indicates which L1 blocks are spanned by the designated transfer frame. The ALFN n is the absolute L1 frame number.

Figure 23:
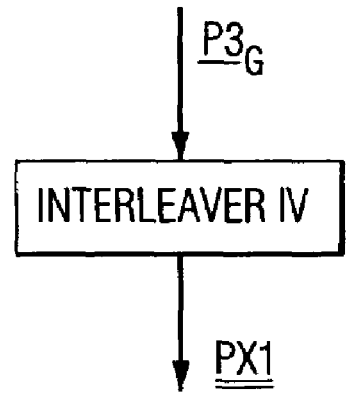
FIG. 23 is a functional block diagram of an interleaver constructed in accordance with this invention.

FIG. 23 shows the PX IP for service modes MP2 through MP4 when P3IS=1. In these service modes, the PX IP interleaves $\underline{P3}_G$ transfer frames into an internal interleaver matrix and outputs them to PX1 (the output interleaver matrix) using the Interleaver of this invention. The service mode dependent interleaver parameter values are shown in Tables 4 and 5. Although the transfer frame rate is common, the size of the $\underline{P3}_G$ transfer frames varies with service mode. Consequently, the number of interleaver partitions in the PX1 interleaver matrix also varies.

TABLE 4

PX1 Interleaver Parameter Values-Service Modes MP2 through MP4, P3IS = 1

| Service Mode | J | B | C | M | V | b | $I_0$ | N |
|---|---|---|---|---|---|---|---|---|
| MP2 | 2 | 32 | 36 | 4 | [0, 1] | 4608 | N/A | 73728 |
| MP3 | 4 | 32 | 36 | 2 | [0, 1, 2, 3] | 9216 | N/A | 147456 |
| MP4 | 8 | 32 | 36 | 1 | [0, 1, 3, 2, 4, 5, 7, 6] | 18432 | N/A | 294912 |

Although the size of the internal interleaver matrix is 16 $\underline{P3}_G$ transfer frames, the interleaver is described as processing one $\underline{P3}_g$ transfer frame at a time. Every time a bit is written to the internal interleaver matrix used by the interleaver, a bit is read sequentially from this matrix and output sequentially to PX1. The size of PX1 is equal to the length of one $\underline{P3}_G$ transfer frame for consistency with the P3IS=0 case. Thus for every $\underline{P3}_G$ transfer frame processed by the interleaver, the PX1 output matrix is completely filled. Describing the process in this manner makes the subcarrier mapping procedures described below completely transparent to the state of P3IS. After the interleaver has consumed 16 $\underline{P3}_G$ transfer frames and 16 PX1 matrices have been filled and output, the internal interleaver matrix is completely filled, and the processing flow resets.

In practical applications, because the interleaver is convolutional, the number of bits input to and output from the interleaver can be any length less than or equal to N, the capacity of the internal interleaver matrix. The concept of an internal interleaver matrix is described here for notational convenience.

TABLE 5

PX1 Interleaver Parameter Values-Service Modes MP5 and MP7, P3IS = 1

| Service Mode | J | B | C | M | V | b | $I_0$ | N |
|---|---|---|---|---|---|---|---|---|
| MP5 | 4 | 32 | 36 | 2 | [0, 1, 2, 3] | 9216 | N/A | 147456 |
| MP7 | 4 | 32 | 36 | 2 | [0, 1, 2, 3] | 9216 | N/A | 147456 |

Under the direction of the upper layers, System Control Processing assembles and differentially encodes a sequence of bits (system control data sequence) destined for each reference subcarrier. There are up to 61 reference subcarriers, numbered 0 . . . 60, distributed throughout the OFDM spectrum. The number of reference subcarriers broadcast in a given waveform depends on the service mode. However, System Control Processing always outputs all 61 system control data sequences, regardless of service mode.

Figure 24:
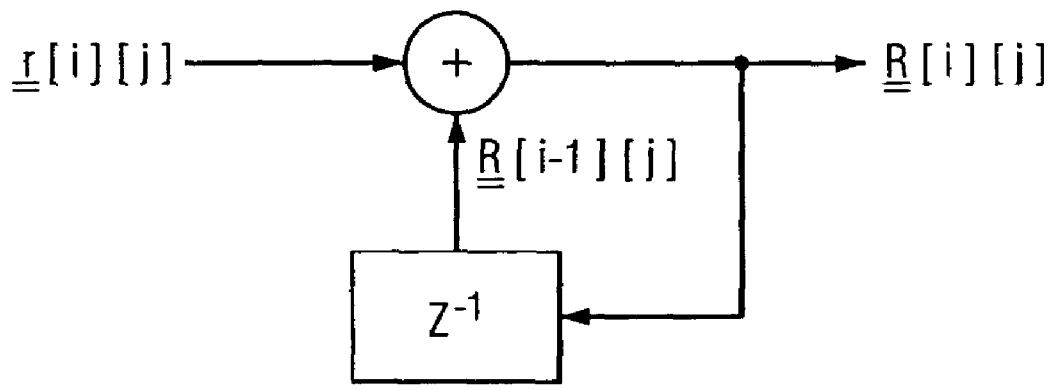
FIG. 24 is a schematic diagram of a differential encoder.

The bits in each column of the 32×61 matrix r, assembled by the System Control Data Sequence Assembler, are differentially encoded in accordance with FIG. 24, and are output to the matrix R in the same order. Conceptually, this process can be viewed as 61 parallel differential encoders. For an individual differential encoder, the bits of a single column j of r are processed sequentially, from i=0 . . . 31. One system control data sequence bit is input to a differential encoder at a time. This input bit is modulo-2 added with the previously stored output bit R[i−1][j] to form the latest output bit, R[i][j]. The resulting output bit stream will reverse polarity each time the input bit is a 1. The initial state of each differential encoder is 0.

Figure 25:
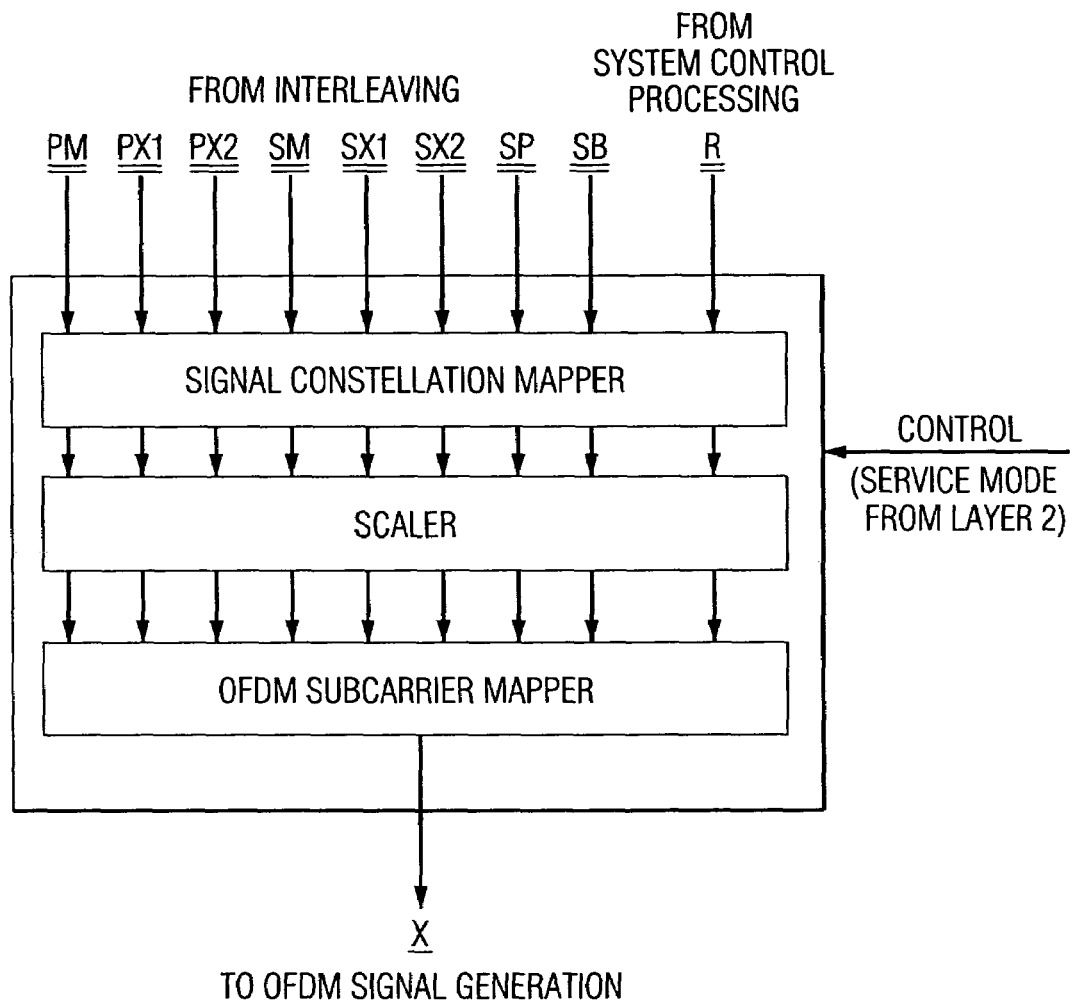
FIG. 25 is a functional block diagram of a signal constellation mapper.

OFDM Subcarrier Mapping assigns interleaver partitions to frequency partitions. For each active interleaver matrix, OFDM Subcarrier Mapping assigns a row of bits from each interleaver partition to its respective frequency partition in the complex output vector X. In addition, system control data sequence bits from a row of R are mapped to the active reference subcarrier locations in X. The service mode dictates which interleaver matrices and which elements of R are active. FIG. 25 shows the inputs, output, and component functions of OFDM Subcarrier Mapping.

The inputs to OFDM Subcarrier Mapping are a row of bits from each active interleaver matrix and a row of bits from R, the matrix of system control data sequences.

The output from OFDM Subcarrier Mapping for each OFDM symbol is a single complex vector, X, of length 1093. The vector is indexed from k=0, 1, 2, . . . , 1092. The $k^{th}$ element of X corresponds to subcarrier (k−546).

| Index into X      | 0    | 1    | 2    | ■ ■ ■ | 1090 | 1091 | 1092 |
|-------------------|------|------|------|-------|------|------|------|
| Subcarrier Number | −546 | −545 | −544 | ■ ■ ■ | 544  | 545  | 546  |

Active elements in a row of R and the associated row from each active interleaver matrix are assigned to the same instance of X.

The Signal Constellation Mapper translates pairs of bits read from interleaver partitions and individual bits read from R to complex constellation values. The Scaler function applies the appropriate amplitude gain factor to these complex values. The gain factor is determined by the desired signal level. The OFDM Subcarrier Mapper maps the scaled complex constellation values to the appropriate elements of the output vector X. Elements of X corresponding to unused subcarriers are set to the complex value 0+j0.

For each active interleaver matrix, a row of bits is processed every $T_s$. Rows are processed sequentially, starting with the first row (row 0). When all rows of an interleaver matrix have been processed, the next instance of that interleaver matrix is processed, starting with the first row.

For a given row of an interleaver matrix, bits are processed by interleaver partition. Pairs of adjacent columns within an interleaver partition are mapped to individual complex, quadrature phase shift keying (QPSK)-modulated data subcarriers within a frequency partition. This mapping proceeds sequentially. The first two columns (0 and 1) of an interleaver partition are mapped to the starting subcarrier number of a frequency partition, and the last two columns of an interleaver partition are mapped to the ending subcarrier number of a frequency partition.

To map each adjacent column pair within an interleaver partition to a subcarrier location within the vector X, the following steps are taken:

1. Read a pair of bits from adjacent columns within an interleaver partition. For a given column pair, the bit read from the lower indexed column is mapped as an I bit, and the bit read from the higher indexed column is mapped as a Q bit.
2. Map the bit pair from Step 1 to a complex constellation value. The I bit maps to the real component and the Q bit maps to the imaginary component of the constellation value.
3. Scale the I and Q components of the complex constellation value from Step 2 using an appropriate amplitude scale factor. The amplitude scale factor is chosen based on subcarrier location and, for the secondary sidebands, the value of ASF.
4. Map the scaled constellation value from Step 3 to the appropriate element of X.

Reference subcarrier matrix R is read one row at a time and a row of R is processed every $T_s$. Each row of R is a vector of bits of length 61, indexed from 0 to 60. Selected bits of this vector are mapped to reference subcarriers according to service mode.

Since the output vector X contains complex values, the following steps are taken to map a row of R to an element of X:

1. Read a bit value from a row vector of R.
2. Map the bit to a complex, binary phase shift keying (BPSK)-modulated constellation value.
3. Scale the I and Q components of the complex constellation value using the appropriate amplitude scale factor and, for secondary subcarriers, according to the state of ASF.
4. Map the scaled constellation value to the appropriate element of X for the current service mode.

Figure 26:
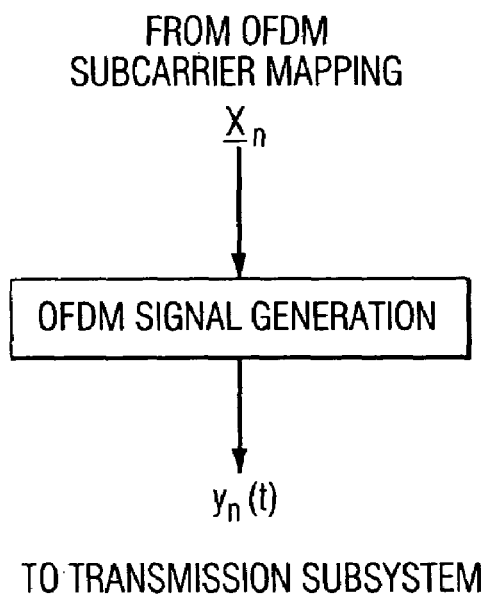
FIG. 26 is a functional block diagram of an OFDM signal generator.

OFDM Signal Generation receives complex, frequency-domain OFDM symbols from OFDM Subcarrier Mapping, and outputs time-domain pulses representing the digital portion of the FM signal. A conceptual block diagram of OFDM Signal Generation is shown in FIG. 26.

The input to OFDM Signal Generation is a complex vector $X_n$ of length L, representing the complex constellation values for each OFDM subcarrier in OFDM symbol n. For notational convenience, the output of OFDM Subcarrier Mapping described above did not use the subscript n. Rather, it referred to the vector X as representing a single OFDM symbol. In the following description, the subscript is appended to X because of the significance of n to OFDM Signal Generation.

The output of OFDM Signal Generation is a complex, baseband, time-domain pulse $y_n(t)$, representing the digital portion of the FM HD Radio signal for OFDM symbol n. Let $X_n[k]$ be the scaled constellation points from OFDM Subcarrier Mapping for the $n^{th}$ symbol, where k=0, 1, . . . , L−1 indexes the OFDM subcarriers. Let $y_n(t)$ denote the time-domain output of OFDM Signal Generation for the $n^{th}$ symbol. Then $y_n(t)$ is written in terms of $X_n[k]$ as follows:

$$y_n(t) = h(t - nT_s) \cdot \sum_{k=0}^{L-1} \underline{X}_n[k] \cdot e^{j2\pi \cdot \Delta f \left[k - \frac{(L-1)}{2}\right] \cdot (t - nT_s)}$$

where n=0, 1, ..., ∞, 0≦t<∞, L=1093 is the total number of OFDM subcarriers, and $T_s$ and $\Delta f$ are the OFDM symbol duration and OFDM subcarrier spacing, respectively.

The pulse-shaping function h(ξ) is defined as:

$$h(\xi) = \begin{cases} \cos\left(\pi \frac{\alpha T - \xi}{2\alpha T}\right) & \text{if } 0 < \xi < \alpha T \\ 1 & \text{if } \alpha T \leq \xi \leq T \\ \cos\left(\pi \frac{T - \xi}{2\alpha T}\right) & \text{if } T < \xi < T(1 + \alpha) \\ 0 & \text{elsewhere} \end{cases}$$

where α is the cyclic prefix width, and $$T = \frac{1}{\Delta f}$$

is the reciprocal of the OFDM subcarrier spacing.

The Transmission Subsystem formats the baseband FM waveform for transmission through the VHF channel. Functions include symbol concatenation and frequency up-conversion. In addition, when transmitting the Hybrid or Extended Hybrid waveforms, this function modulates the baseband analog signal before combining it with the digital waveform.

The input to this module is a complex, baseband, time-domain OFDM symbol, $y_n(t)$, from the OFDM Signal Generation function. A baseband analog signal m(t) is also input from an analog source, along with optional subsidiary communications authorization (SCA) signals, when transmitting the Hybrid or Extended Hybrid waveform. The output of this module is the VHF FM waveform.

Figure 27:
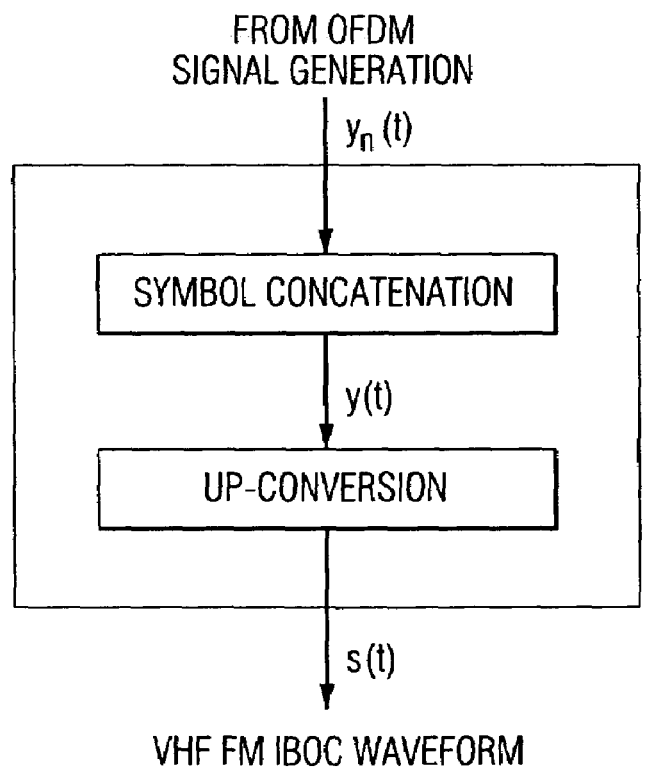
FIG. 27 is a functional block diagram of a signal converter.
Figure 28:
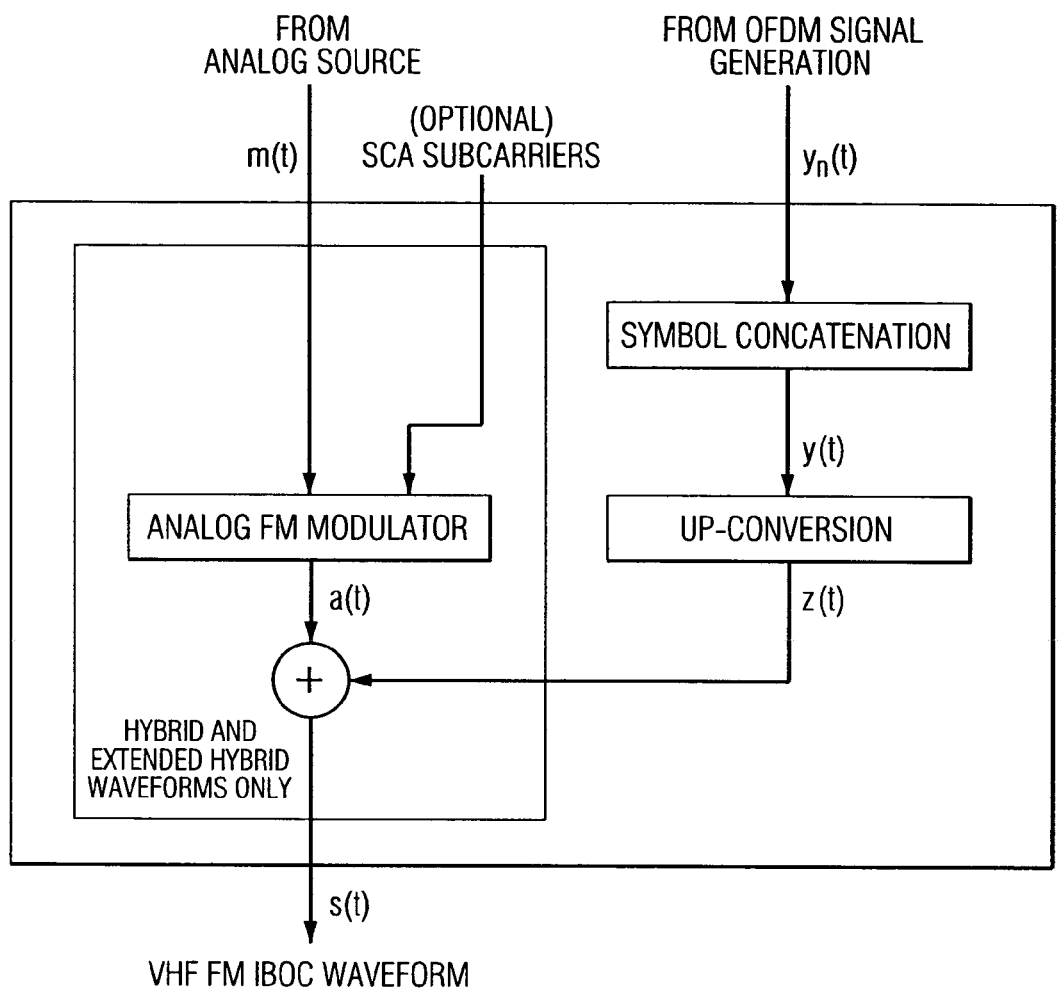
FIG. 28 is a functional block diagram of a DAB modulator.

Refer to FIG. 27 for a functional block diagram of the All Digital Transmission Subsystem, and FIG. 28 for a functional block diagram of the Hybrid and Extended Hybrid transmission subsystems.

When broadcasting the Hybrid or Extended Hybrid waveform, the analog-modulated FM RF signal is combined with the digitally-modulated RF signal to produce the VHF FM waveform, s(t). When broadcasting service modes MP1-MP4 the upper layers establish precise timing relationship between the analog and digital signals. In this case, service mode changes to any other Hybrid or Extended Hybrid waveform shall not cause any interruptions or discontinuities in the analog signal. In service modes MP5-MP7, no precise timing relationship is required. Both the analog and digital portions of the waveform are centered on the same carrier frequency.

This invention provides a method for interleaving bits of a digital signal representative of data and/or audio in a digital audio broadcasting system, the method comprising the step of: writing a plurality of bits of the digital signal to a matrix; and reading the bits from the matrix, wherein at least one of the writing and reading steps follows a non-sequential addressing scheme. "Non-sequential addressing scheme" means allocating matrix addresses by one or more patterns and/or formulas, wherein the addresses are not in contiguous order. A set of such formulas is described above.

The number of bits in the matrix can be equal to the number of bits in a transfer frame of the digital signal. The bits in the matrix are arranged in a plurality of partitions, and each of the partitions can include a plurality of blocks.

Each of the partitions can include a group of the bits representative of a logical channel, and the bits of the logical channels can be scrambled.

The invention also encompasses a method of broadcasting digital information representative of data and/or audio in a digital audio broadcasting system, the method comprising the steps of: receiving a plurality of bits of a digital signal to be transmitted; writing the bits to a matrix; reading the bits from the matrix, wherein at least one of the writing and reading steps follows a non-sequential addressing scheme; mapping the bits to a plurality of carrier signals; and transmitting the carrier signals.

The bits can be channel coded prior to the step of writing the bits of the digital signal to the matrix. The bits can also be scrambled prior to the step of writing the bits of the digital signal to the matrix.

In another aspect, the invention provides an apparatus for interleaving bits of a digital signal representative of data and/or audio in a digital audio broadcasting system. The apparatus comprises: means for receiving a plurality of bits of a digital signal to be transmitted; means for writing the bits to a matrix; and means for reading the bits from the matrix, wherein at least one of the means for writing and the means for reading follows a non-sequential addressing scheme, all of which can be within the multiplex subsystem 26 in FIG. 1.

The invention further encompasses an apparatus for broadcasting digital information representative of data and/or audio in a digital audio broadcasting system, as shown in FIG. 1. The apparatus comprises: means for receiving a plurality of bits of a digital signal to be transmitted; means for writing the bits of the digital signal to a matrix; means for reading the bits from the matrix, wherein at least one of the means for writing and the means for reading follows a non-sequential addressing scheme; means for mapping the bits to a plurality of carrier signals; and means for transmitting the carrier signals.

In another aspect, the invention provides a method for deinterleaving received bits of a digital signal representative of data and/or audio in a digital audio broadcasting system, the method comprising the steps of: writing a plurality of received bits of the digital signal to a matrix; and reading the bits from the matrix, wherein at least one of the writing and reading steps follows a non-sequential addressing scheme.

The invention further encompasses a method of receiving digital information representative of data and/or audio in a digital audio broadcasting system, the method comprising the steps of: receiving a plurality of bits of a digital signal; writing the bits to a matrix; reading the bits from the matrix, wherein at least one of the means for writing and means for reading follows a non-sequential addressing scheme; and using the read bits to produce an output signal. The deinterleaving and receiving methods can be performed in the receiver shown in FIG. 1.

The invention also encompasses an apparatus for deinterleaving bits of a digital signal representative of data and/or audio in a digital audio broadcasting system, the apparatus comprising: means for receiving a plurality of bits of a digital signal; means for writing the bits to a matrix; and means for reading the bits from the matrix, wherein at least one of the means for writing and means for reading follows a non-sequential addressing scheme.

In another aspect, the invention provides an apparatus of receiving digital information representative of data and/or audio in a digital audio broadcasting system, the apparatus comprising: means for receiving a plurality of bits of a digital signal; means for writing the bits of the digital signal to a matrix; means for reading the bits from the matrix, wherein at least one of the means for writing and means for reading follows a non-sequential addressing scheme; and means for using the read bits to produce an output signal. The deinterleaving and receiving apparatus is shown as the receiver shown in FIG. 1.

While the present invention has been described in terms of its preferred embodiment, it will be understood by those skilled in the art that various modifications can be made to the disclosed embodiment without departing from the scope of the invention as set forth in the claims.

What is claimed is:

1. A method for interleaving bits of a digital signal representative of data and/or audio in a digital audio broadcasting system, the method comprising the steps of:
   writing a plurality of bits of the digital signal to an internal matrix;
   reading the bits from the internal matrix, wherein at least one of the writing and reading steps follows a non-sequential addressing scheme; and
   writing the bits to an output matrix.

2. The method of claim 1, wherein the number of bits in the output matrix is equal to the number of bits in a transfer frame of the digital signal.

3. The method of claim 1, wherein the bits in the internal matrix are arranged in a plurality of partitions.

4. The method of claim 3, wherein each of the partitions comprises a plurality of blocks.

5. The method of claim 3, wherein each of the partitions includes a group of the bits representative of a logical channel.

6. The method of claim 5, wherein the bits in each logical channel are scrambled.

7. A method of broadcasting digital information representative of data and/or audio in a digital audio broadcasting system, the method comprising the steps of:
   receiving a plurality of bits of a digital signal to be transmitted;
   writing the bits to an internal matrix;
   reading the bits from the internal matrix, wherein at least one of the writing and reading steps follows a non-sequential addressing scheme;
   writing the bits to an output matrix;
   mapping the bits to a plurality of carrier signals; and
   transmitting the carrier signals.

8. The method of claim 7, wherein the number of bits in the output matrix is equal to the number of bits in a transfer frame of the digital signal.

9. The method of claim 7, wherein the bits in the internal matrix are arranged in a plurality of partitions.

10. The method of claim 9, wherein each of the partitions comprises a plurality of blocks.

11. The method of claim 9, wherein each of the partitions includes a group of the bits representative of a logical channel.

12. The method of claim 11, wherein the bits in each logical channel are scrambled.

13. The method of claim 7, further comprising the step of:
    channel coding the bits prior to the step of writing the bits of the digital signal to the internal matrix.

14. The method of claim 7, further comprising the step of:
    scrambling the bits prior to the step of writing the bits of the digital signal to the internal matrix.

15. An apparatus for interleaving bits of a digital signal representative of data and/or audio in a digital audio broadcasting system, the apparatus comprising:
    means for receiving a plurality of bits of a digital signal to be transmitted;
    means for writing the bits to an internal matrix;
    means for reading the bits from the internal matrix, wherein at least one of the means for writing and the means for reading follows a non-sequential addressing scheme; and
    means for writing the bits to an output matrix.

16. The apparatus of claim 15, wherein the number of bits in the output matrix is equal to the number of bits in a transfer frame of the digital signal.

17. The apparatus of claim 15, wherein the bits in the internal matrix are arranged in a plurality of partitions.

18. The apparatus of claim 17, wherein each of the partitions comprises a plurality of blocks.

19. The apparatus of claim 17, wherein each of the partitions includes a group of the bits representative of a logical channel.

20. The apparatus of claim 19, wherein the bits in each logical channel are scrambled.

21. An apparatus of broadcasting digital information representative of data and/or audio in a digital audio broadcasting system, the apparatus comprising:
    means for receiving a plurality of bits of a digital signal to be transmitted;
    means for writing the bits of the digital signal to an internal matrix;
    means for reading the bits from the internal matrix, wherein at least one of the means for writing and the means for reading follows a non-sequential addressing scheme;
    means for writing the bits to an output matrix;
    means for mapping the bits to a plurality of carrier signals; and
    means for transmitting the carrier signals.

22. The apparatus of claim 21, wherein the number of bits in the output matrix is equal to the number of bits in one of the transfer frames.

23. The apparatus of claim 21, wherein the bits in the internal matrix are arranged in a plurality of partitions.

24. The apparatus of claim 23, wherein each of the partitions comprises a plurality of blocks.

25. The apparatus of claim 23, wherein each of the partitions includes a group of the bits representative of a logical channel.

26. The apparatus of claim 25, wherein the bits in each logical channel are scrambled.

27. The apparatus of claim 21, further comprising:
    means for channel coding the bits prior to the step of writing the bits of the digital signal to the internal matrix.

28. The apparatus of claim 21, further comprising:
    means for scrambling the bits prior to the step of writing the bits of the digital signal to the internal matrix.

29. A method for deinterleaving received bits of a digital signal representative of data and/or audio in a digital audio broadcasting system, the method comprising the steps of:
    writing a plurality of received bits of the digital signal to an internal matrix;

reading the bits from the internal matrix, wherein at least one of the writing and reading steps follows a non-sequential addressing scheme; and writing the bits to an output matrix.

30. The method of claim 29, wherein the number of bits in the output matrix is equal to the number of bits in a transfer frame of the digital signal.

31. A method of receiving digital information representative of data and/or audio in a digital audio broadcasting system, the method comprising the steps of:

receiving a plurality of bits of a digital signal;

writing the bits to an internal matrix;

reading the bits from the internal matrix, wherein at least one of the means for writing and means for reading follows a non-sequential addressing scheme;

writing the read bits to an output matrix; and using the read bits to produce an output signal.

32. The method of claim 31, wherein the number of bits in the output matrix is equal to the number of bits in a transfer frame of the digital signal.

33. An apparatus for deinterleaving bits of a digital signal representative of data and/or audio in a digital audio broadcasting system, the apparatus comprising:

means for receiving a plurality of bits of a digital signal;

means for writing the bits to an internal matrix;

means for reading the bits from the internal matrix, wherein at least one of the means for writing and means for reading follows a non-sequential addressing scheme;

means for writing the bits of the digital signal to an output matrix; and means for using the read bits to produce an output signal.

34. The apparatus of claim 33, wherein the number of bits in the output matrix is equal to the number of bits in a transfer frame of the digital signal.

35. An apparatus for receiving digital information representative of data and/or audio in a digital audio broadcasting system, the apparatus comprising:

a receiver including circuitry for receiving a plurality of bits of a digital signal;

for writing the bits of the digital signal to an internal matrix;

for reading the bits from the internal matrix, wherein at least one of the means for writing and means for reading follows a non-sequential addressing scheme;

for writing the bits of the digital signal to an output matrix; and for using the read bits to produce an output signal.

36. The apparatus of claim 35, wherein the number of bits in the output matrix is equal to the number of bits in one of the transfer frames.

37. A method for interleaving bits of a digital signal representative of data and/or audio in a digital audio broadcasting system, the method comprising the steps of;

writing a plurality of bits of the digital signal to an internal matrix in a convolutional interleaver, wherein the plurality of bits are arranged in a plurality of interleaver partitions;

reading the bits from the internal matrix;

writing the bits read from the internal matrix to an output matrix; and mapping bits from the interleaver partitions to frequency partitions in a radio signal.

38. The method of claim 37, wherein the interleaver partitions include rows of bits and each row of bits is assigned to one of the frequency partitions.

39. The method of claim 38, wherein each row of bits is mapped to one of the frequency partitions as a complex vector.

40. The method of claim 38, wherein the rows of bits are processed sequentially.

41. The method of claim 37, wherein the plurality of bits includes control data sequence bits, and the control data sequence bits are mapped to a reference subcarrier in the radio signal.

42. The method of claim 37, wherein at least one of the writing and reading steps follows a non-sequential addressing scheme.

43. The method of claim 37, wherein the radio signal comprises an orthogonal frequency division multiplexed signal and a row of bits in the matrix is processed for each symbol in the orthogonal frequency division multiplexed signal.

44. The method of claim 37, wherein the plurality of bits of the digital signal comprises channel coded transfer frames.

45. The method of claim 37, further comprising the steps of:

translating pairs of the bits from the interleaver partitions and individual bits from the output matrix into complex constellation values; and applying an amplitude gain factor to the complex constellation values.

46. The method of claim 37, wherein the pairs of columns in the interleaver partitions are mapped to quadrature phase shift keying modulated subcarriers in the frequency partitions.

* * * * *